(12) United States Patent

Yamane et al.

(10) Patent No.: US 12,641,914 B2

(45) Date of Patent: May 26, 2026

(54) LIGHT DETECTION ELEMENT, RECEIVING DEVICE, AND LIGHT SENSOR DEVICE

(71) Applicant: TDK CORPORATION, Tokyo (JP)

(72) Inventors: Takekazu Yamane, Tokyo (JP); Hideaki Fukuzawa, Tokyo (JP); Tetsuya Shibata, Tokyo (JP); Tomohito Mizuno, Tokyo (JP)

(73) Assignee: TDK CORPORATION, Tokyo (JP)

( * ) Notice: Subject to any disclaimer, the term of this patent is extended or adjusted under 35 U.S.C. 154(b) by 931 days.

(21) Appl. No.: 17/845,050

(22) Filed: Jun. 21, 2022

(65) Prior Publication Data

US 2022/0416096 A1 Dec. 29, 2022

(30) Foreign Application Priority Data

Jun. 23, 2021 (JP) ................................. 2021-103981
Mar. 25, 2022 (JP) ................................. 2022-050483

(51) Int. Cl.
H10F 77/40 (2025.01)
G01R 33/00 (2006.01)
H01F 10/32 (2006.01)

(52) U.S. Cl.
CPC ......... H10F 77/40 (2025.01); H01F 10/3254 (2013.01); G01R 33/0052 (2013.01)

(58) Field of Classification Search
CPC ...... H01F 77/40; H01F 10/3254; H01F 39/12; H01F 30/00; G01R 33/0052; G01R 33/0094; G01R 33/0206; G01R 33/096; G01R 33/098; G01R 33/1284
See application file for complete search history.

(56) References Cited

U.S. PATENT DOCUMENTS

| | | | | |
|---|---|---|---|---|
| 4,805,006 A | | 2/1989 | Yamaguchi et al. | |
| 6,364,542 B1 | | 4/2002 | Deane et al. | |
| 6,925,261 B2 | | 8/2005 | Haruyama | |
| 9,842,874 B2 | | 12/2017 | Nakata | |
| 11,703,380 B2 * | | 7/2023 | Fukuzawa ................. | G01J 1/42 |
| | | | | 250/215 |
| 11,703,381 B2 * | | 7/2023 | Degawa ................... | G01J 3/513 |
| | | | | 250/206 |

(Continued)

FOREIGN PATENT DOCUMENTS

| | | |
|---|---|---|
| JP | S64-26863 U | 2/1989 |
| JP | H08-078703 A | 3/1996 |

(Continued)

OTHER PUBLICATIONS

U.S. Appl. No. 19/005,156.*

(Continued)

*Primary Examiner* — David A Zarneke
(74) *Attorney, Agent, or Firm* — Oliff PLC

(57) ABSTRACT

A light detection element includes: a plurality of magnetic elements, wherein each of the magnetic elements includes a first ferromagnetic layer that is irradiated with light and a second ferromagnetic layer and a spacer layer sandwiched between the first ferromagnetic layer and the second ferromagnetic layer, and wherein at least two of the magnetic elements are arranged to be inside a spot of the light applied to the first ferromagnetic layers of the at least two of the magnetic elements.

13 Claims, 17 Drawing Sheets

(56) References Cited

U.S. PATENT DOCUMENTS

| | | | |
|---|---|---|---|
| 11,722,222 B2 * | 8/2023 | Fukuzawa | H04B 10/532 |
| | | | 398/152 |
| 12,218,161 B2 * | 2/2025 | Fukuzawa | H10F 39/8053 |
| 2001/0040713 A1 | 11/2001 | Haruyama | |
| 2002/0063919 A1 | 5/2002 | Kovar et al. | |
| 2003/0169979 A1 | 9/2003 | Fujita et al. | |
| 2004/0213511 A1 | 10/2004 | Scholz | |
| 2007/0223149 A1 | 9/2007 | Kim et al. | |
| 2008/0284010 A1 | 11/2008 | Romig | |
| 2010/0008675 A1 | 1/2010 | De Dobbelaere | |
| 2014/0064659 A1 | 3/2014 | Doerr et al. | |
| 2015/0333839 A1 | 11/2015 | Li et al. | |
| 2016/0172399 A1 | 6/2016 | Nakata | |
| 2018/0261760 A1 | 9/2018 | Hiraki et al. | |
| 2019/0172964 A1 | 6/2019 | Hermes et al. | |
| 2019/0305016 A1 | 10/2019 | Tsang et al. | |
| 2021/0159392 A1 | 5/2021 | Prasad et al. | |
| 2021/0359201 A1 | 11/2021 | Sun et al. | |
| 2021/0404867 A1 | 12/2021 | Jaiswal et al. | |
| 2022/0010423 A1 | 1/2022 | Suzuki et al. | |
| 2022/0068537 A1 | 3/2022 | Mizuno et al. | |
| 2022/0252449 A1 | 8/2022 | Degawa | |
| 2022/0260425 A1 | 8/2022 | Jacob et al. | |
| 2023/0333022 A1 | 10/2023 | Fukuzawa et al. | |
| 2024/0021231 A1 | 1/2024 | Jacob et al. | |

FOREIGN PATENT DOCUMENTS

| | | |
|---|---|---|
| JP | 2001-292107 A | 10/2001 |
| JP | 2003-209327 A | 7/2003 |
| JP | 2003-262765 A | 9/2003 |
| JP | 2003-304013 A | 10/2003 |
| JP | 2005-011907 A | 1/2005 |
| JP | 2008-306094 A | 12/2008 |
| JP | 2012-123395 A | 6/2012 |
| JP | 2013-257437 A | 12/2013 |
| JP | 2015-026675 A | 2/2015 |
| JP | 2018-152452 A | 9/2018 |
| JP | 2019-523562 A | 8/2019 |
| JP | 2021-519511 A | 8/2021 |

OTHER PUBLICATIONS

U.S. Appl. No. 18/075,603.*

Chen et al., "All-Optical Switching of Magnetic Tunnel Junctions with Single Subpicosecond Laser Pulses," Physical Review Applied, 2017, vol. 7, pp. 021001-1-021001-6.

Azim et al., "Optical Receiver With Helicity-Dependent Magetization Reversal", IEEE Transactions on Magnetics, Jan. 2019, vol. 55, No. 1, pp. 1-6.

Machida et al., "Spin Transfer Switching and MR Properties of Co/Pt Multilayered Free Layers for Submicron Sized Magneto-Optical Light Modulation Device", IEEE Transactions of Magnetics, Jun. 2010, vol. 46, No. 6, pp. 2171-2174.

Aug. 15, 2022 Office Action issued in U.S. Appl. No. 17/507,143.

Jun. 4, 2024 U.S. Office Action issued in U.S. Appl. No. 17/559,135.

Aug. 8, 2024 Office Action issued in U.S. Appl. No. 18/328,817.

Jan. 5, 2024 U.S. Office Action issued in U.S. Appl. No. 18/210,333.

Nov. 4, 2022 Office Action issued in U.S. Appl. No. 17/507,088.

Dec. 16, 2022 Notice of Allowance Issued in U.S. Appl. No. 17/507,143.

U.S. Appl. No. 17/559,135, filed Dec. 22, 2021 in the name of Hideaki Fukuzawa.

U.S. Appl. No. 17/507,143, filed Oct. 21, 2021 in the name of Hideaki Fukuzawa.

U.S. Appl. No. 17/507,088, filed Oct. 21, 2021 in the name of Hideaki Fukuzawa.

Mar. 8, 2024 Office Action issued in U.S. Appl. No. 18/328,817.

Translation of Feb. 10, 2026 Office Action issued in Japanese Application 2021-154423.

Akira Oiwa, Spin-injection induced magnetization reversal in III-V-based magnetic semiconductors, Research Assistance of Yamada Science Foundation, Sep. 29, 2002.

Translation of Feb. 24, 2026 Office Action issued in Japanese Application No. 2025-075297.

* cited by examiner

LIGHT DETECTION ELEMENT, RECEIVING DEVICE, AND LIGHT SENSOR DEVICE

CROSS-REFERENCES TO RELATED APPLICATIONS

This application relies for priority upon Japanese Patent Application No. 2021-103981, filed on Jun. 23, 2021 and Japanese Patent Application No. 2022-050483, filed on Mar. 25, 2022, the entire contents of which are hereby incorporated herein by reference for all purposes as if fully set forth herein.

BACKGROUND

The present disclosure relates to a light detection element, a receiving device, and a light sensor device.

A photoelectric conversion element has been used for various purposes.

For example, Patent Document 1 describes a receiving device that receives an optical signal using a photodiode. The photodiode is, for example, a pn junction diode using a pn junction of a semiconductor and converts light into an electric signal.

Further, for example, Patent Document 2 describes a light sensor using a pn junction of a semiconductor and an image sensor using this light sensor.

PATENT DOCUMENTS

[Patent Document 1] Japanese Unexamined Patent Application No. 2001-292107
[Patent Document 2] U.S. Pat. No. 9,842,874

SUMMARY

A light detection element using a pn junction of a semiconductor is widely used, but a new light detection element is required for further development. Further, the light detection element is used to convert light into an electric signal and is required to improve a SN ratio which is a ratio of signal to noise in light detection.

It is desirable to provide a light detection element, a receiving device, and a light sensor device having a large SN ratio.

The following means are provided.

A light detection element according to a first aspect includes: a plurality of magnetic elements, each of the magnetic elements includes a first ferromagnetic layer that is irradiated with light and a second ferromagnetic layer and a spacer layer sandwiched between the first ferromagnetic layer and the second ferromagnetic layer, and at least two of the magnetic elements are arranged to be inside a spot of the light applied to the first ferromagnetic layers of the at least two of the magnetic elements.

A receiving device according to a second aspect includes the light detection element according to the first aspect.

A light sensor device according to a third aspect includes the light detection element according to the first aspect.

DETAILED DESCRIPTION

Hereinafter, embodiments will be appropriately described in detail with reference to the drawings. The drawings used in the following descriptions may be enlarged for convenience in order to make the features easier to understand and the dimensional ratios of each component may differ from the actual ones. The materials, dimensions, and the like exemplified in the following descriptions are examples. The present disclosure is not limited thereto and can be appropriately modified and carried out within the range in which the effects of the present disclosure are exhibited.

The light detection element, the receiving device, and the light sensor device according to the embodiment have a large light SN ratio.

The directions will be defined. The lamination direction of magnetic elements 10 is referred to as the z direction, one direction in the plane orthogonal to the z direction is referred to as the x direction, and the direction orthogonal to the x direction and the z direction is referred to as the y direction. The z direction is an example of the lamination direction. Hereinafter, the +z direction is referred to as the "upside" and the −z direction is referred to as the "downside". The +z direction is a direction from the second ferromagnetic layer 2 toward the first ferromagnetic layer 1. The up and down do not always match the direction in which gravity is applied.

First Embodiment

Figure 1:
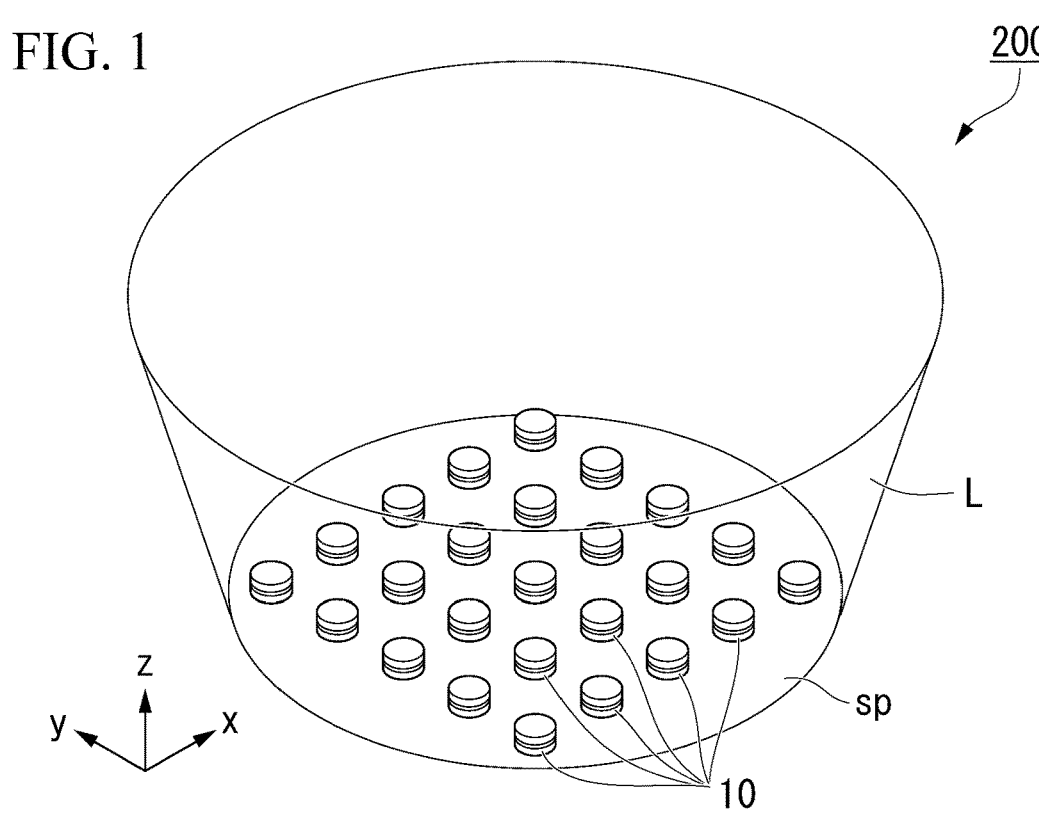
FIG. 1 is a perspective view of a light detection element according to a first embodiment.
Figure 2:
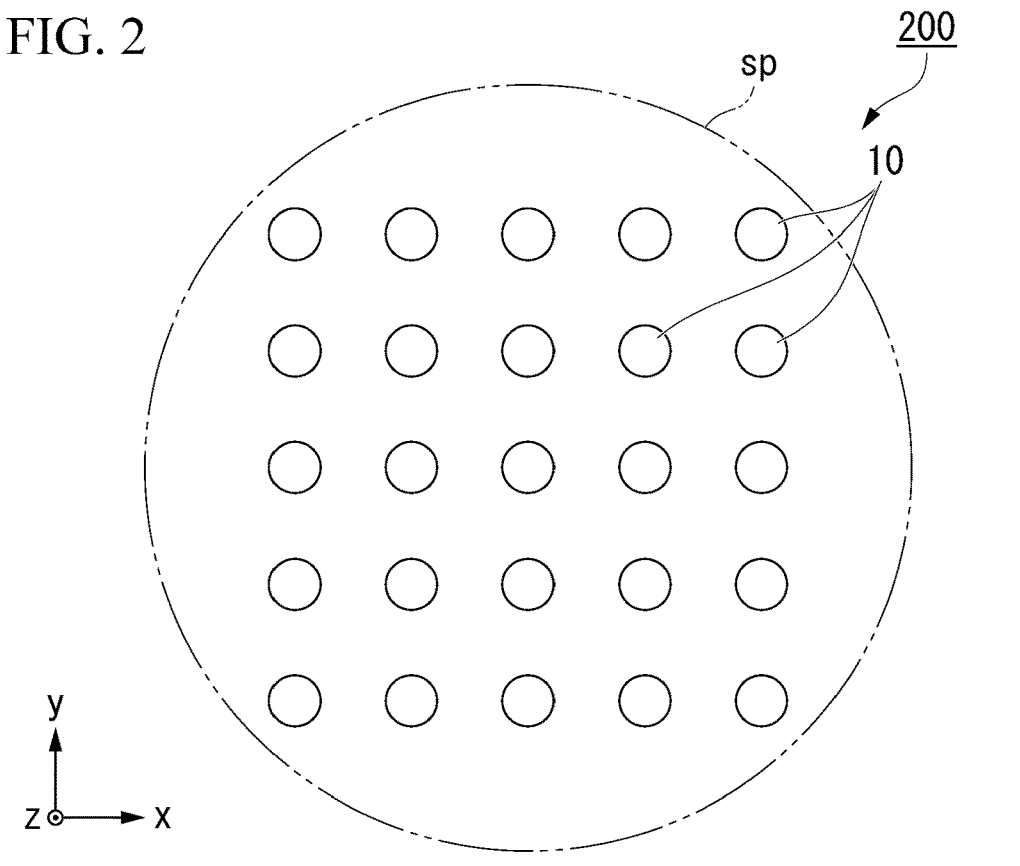
FIG. 2 is a plan view of the light detection element according to the first embodiment.

FIG. 1 is a perspective view of a light detection element 200 according to a first embodiment. FIG. 2 is a plan view in which the light detection element 200 according to the first embodiment is viewed from the z direction.

The light detection element 200 replaces the state of applied light L or a change in the state with an electric signal. The light detection element 200 includes a plurality of the magnetic elements 10. The magnetic elements 10 are arranged to be in a spot sp of the applied light L.

The light L includes not only visible light but also infrared rays having a wavelength longer than that of the visible light and ultraviolet rays having a wavelength shorter than that of the visible light. The wavelength of the visible light is, for example, 380 nm or more and less than 800 nm. The wavelength of the infrared rays is, for example, 800 nm or more and 1 mm or less. The wavelength of the ultraviolet rays is, for example, 200 nm or more and less than 380 nm. The light L is, for example, light which includes a high-frequency optical signal and of which the intensity changes or light of which the wavelength range is controlled (for example, light that has passed through a wavelength filter). The high-frequency optical signal is, for example, a signal having a frequency of 100 MHz or more. The light L may be a laser beam.

The spot sp is a range in which the light L is applied to the irradiated object. The range of the spot sp is a continuous region including the center, which is irradiated with light having an intensity of 13.5% or more of the light intensity at the center.

The range of the spot sp of the light L is determined by an optical member. The optical member is, for example, a waveguide, a lens, a light source, or the like. For example, the light that has passed through the waveguide forms a spot sp. Further, for example, the light having passed through the lens and focused forms the spot sp. The light detection element 200 may have these optical members that form the spot sp of the light L. In this case, for example, the optical member is disposed at a position in which a first electrode to be described later is sandwiched between the optical member and the magnetic element 10.

For example, each of the magnetic elements 10 is electrically connected to the other magnetic element 10 in series or in parallel. In this case, the light detection element 200 outputs, for example, the combined resistance, combined potential, and the like of the magnetic elements 10. Each of the magnetic elements 10 may be separately connected to a subsequent device. In this case, the light detection element 200 outputs, for example, the resistance, the potential, and the like of each of the magnetic elements 10. In the subsequent device, for example, the outputs from the respective magnetic elements 10 are superposed.

Figures 3, 4:
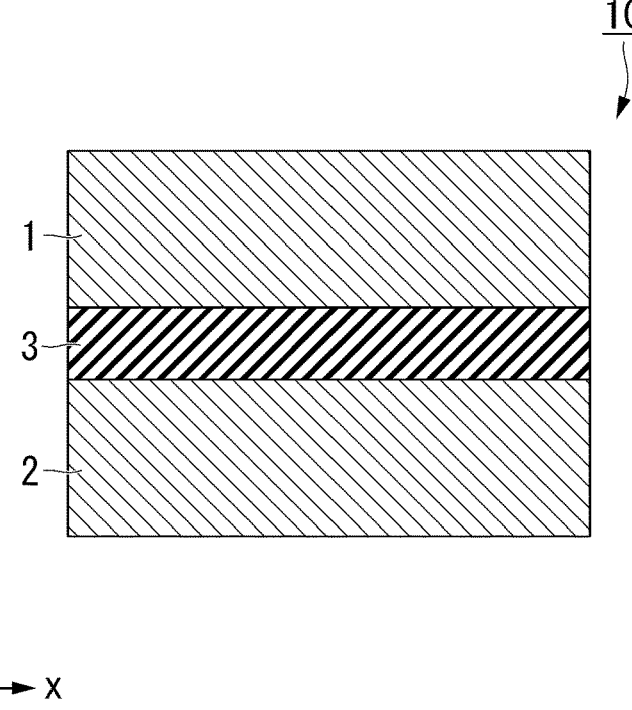
FIG. 3 is a cross-sectional view of a magnetic element according to the first embodiment.
FIG. 4 is a diagram illustrating a first mechanism of a first operation example of the magnetic element according to the first embodiment.

When the state of the light L applied to each of the magnetic elements 10 changes, the voltage output from each of the magnetic element 10 (the potential difference between the ends of the magnetic elements in the z direction) changes in response to a change in the state of the light L. FIG. 3 is a cross-sectional view of the magnetic element 10 according to the first embodiment. Each of the magnetic elements 10 includes, for example, a first ferromagnetic layer 1, a second ferromagnetic layer 2, and a spacer layer 3. The spacer layer 3 is located between the first ferromagnetic layer 1 and the second ferromagnetic layer 2. The magnetic element 10 may include another layer in addition to these. The magnetic element 10 is irradiated with the light from the side of the first ferromagnetic layer 1. Hereinafter, the surface on the side irradiated with the light of the magnetic element 10 is referred to as an irradiation surface.

The magnetic element 10 is, for example, a magnetic tunnel junction (MTJ) element in which the spacer layer 3 is made of an insulating material. In this case, the magnetic element 10 is an element of which the resistance value in the z direction (the resistance value when a current flows in the z direction) changes in response to the relative change between the magnetization state of the first ferromagnetic layer 1 and the magnetization state of the second ferromagnetic layer 2. Such an element is also referred to as a magnetoresistance effect element.

The first ferromagnetic layer 1 is a light detection layer of which a magnetization state changes when light is applied from the outside. The first ferromagnetic layer 1 is also referred to as a magnetization free layer. The magnetization free layer is a layer containing a magnetic material of which a magnetization state changes when a predetermined external force is applied. The predetermined external force is, for example, the light L applied from the outside, a current flowing in the z direction of the magnetic element 10, and an external magnetic field. The magnetization state of the first ferromagnetic layer 1 changes in response to the intensity of the light L applied to the first ferromagnetic layer 1.

The first ferromagnetic layer 1 contains a ferromagnet. The first ferromagnetic layer 1 contains, for example, at least one of magnetic elements such as Co, Fe, and Ni. The first ferromagnetic layer 1 may contain non-magnetic elements such as B, Mg, Hf, and Gd in addition to the above-described magnetic elements. The first ferromagnetic layer 1 may be, for example, an alloy containing a magnetic element and a non-magnetic element. The first ferromagnetic layer 1 may contain a plurality of layers. The first ferromagnetic layer 1 is, for example, a CoFeB alloy, a laminate in which a CoFeB alloy layer is sandwiched between Fe layers, and a laminate in which a CoFeB alloy layer is sandwiched between CoFe layers.

The first ferromagnetic layer 1 may be an in-plane magnetization film having an easy magnetization axis in the film in-plane direction (any direction in the xy-plane) or a perpendicular magnetization film having an easy magnetization axis in the film plane perpendicular direction (z direction).

The film thickness of the first ferromagnetic layer 1 is, for example, 1 nm or more and 5 nm or less. The film thickness of the first ferromagnetic layer 1 may be, for example, 1 nm or more and 2 nm or less. If the film thickness of the first ferromagnetic layer 1 is thin when the first ferromagnetic layer 1 is the perpendicular magnetization film, the vertical magnetic anisotropy applying effect from the layers above and below the first ferromagnetic layer 1 becomes stronger and the vertical magnetic anisotropy of the first ferromagnetic layer 1 becomes higher. That is, if the vertical magnetic anisotropy of the first ferromagnetic layer 1 is high, a force to return the magnetization in the z direction becomes stronger. On the other hand, if the film thickness of the first ferromagnetic layer 1 is thick, the vertical magnetic anisotropy applying effect from the layers above and below the first ferromagnetic layer 1 becomes relatively weaker and the vertical magnetic anisotropy of the first ferromagnetic layer 1 becomes weaker.

The volume as the strong magnetic material becomes smaller if the film thickness of the first ferromagnetic layer 1 becomes thinner and the volume as the strong magnetic material becomes larger if the film thickness becomes thicker. The susceptibility of the magnetization of the first ferromagnetic layer 1 when external energy is applied is inversely proportional to the product (KuV) of the magnetic anisotropy (Ku) and the volume (V) of the first ferromagnetic layer 1. That is, when the product of the magnetic anisotropy of the first ferromagnetic layer 1 and the volume becomes smaller, the reactivity with light increases. From this point of view, the magnetic anisotropy of the first ferromagnetic layer 1 may be appropriately designed and then the volume of the first ferromagnetic layer 1 may be reduced in order to enhance the reaction to light.

When the film thickness of the first ferromagnetic layer 1 is thicker than 2 nm, an insertion layer made of, for example, Mo and W may be provided in the first ferromagnetic layer 1. That is, a laminate in which the ferromagnetic layer, the insertion layer, and the ferromagnetic layer are laminated in order in the z direction may be referred to as the first ferromagnetic layer 1. The interfacial magnetic anisotropy at the interface between the insertion layer and the ferromagnetic layer enhances the vertical magnetic anisotropy of the entire first ferromagnetic layer 1. The film thickness of the insertion layer is, for example, 0.1 nm to 0.6 nm.

The second ferromagnetic layer 2 is a magnetization fixed layer. The magnetization fixed layer is a layer made of a magnetic material of which a magnetization state is less likely to change than the magnetization free layer when a predetermined external energy is applied. For example, the magnetization fixed layer is less likely to change its magnetization direction than the magnetization free layer when a predetermined external energy is applied. Further, for example, in the magnetization fixed layer, the magnitude of magnetization is less likely to change than in the magnetization free layer when the predetermined external energy is applied. The coercive force of the second ferromagnetic layer 2 is larger than, for example, the coercive force of the first ferromagnetic layer 1. The second ferromagnetic layer

2 has, for example, an easy magnetization axis in the same direction as that of the first ferromagnetic layer 1. The second ferromagnetic layer 2 may be an in-plane magnetization film or a perpendicular magnetization film.

The material constituting the second ferromagnetic layer 2 is, for example, the same as that of the first ferromagnetic layer 1. The second ferromagnetic layer 2 may be, for example, a laminate in which Co with a thickness of 0.4 nm to 1.0 nm, Mo with a thickness of 0.1 nm to 0.5 nm, a CoFeB alloy with a thickness of 0.3 nm to 1.0 nm, and Fe with a thickness of 0.3 nm to 1.0 nm are laminated in order.

The magnetization of the second ferromagnetic layer 2 may be fixed, for example, by magnetic coupling with the third ferromagnetic layer via the magnetic coupling layer. In this case, the combination of the second ferromagnetic layer 2, the magnetic coupling layer, and the third ferromagnetic layer may be referred to as the magnetization fixed layer.

The third ferromagnetic layer is magnetically coupled to, for example, the second ferromagnetic layer 2. The magnetic coupling is, for example, an antiferromagnetic coupling and is caused by the RKKY interaction. The material forming the third ferromagnetic layer is the same as, for example, that of the first ferromagnetic layer 1. The magnetic coupling layer is, for example, Ru, Ir, or the like.

The spacer layer 3 is a non-magnetic layer disposed between the first ferromagnetic layer 1 and the second ferromagnetic layer 2. The spacer layer 3 is composed of a layer made of a conductor, an insulator, or a semiconductor or a layer containing an energizing point made of a conductor in the insulator. The film thickness of the spacer layer 3 can be adjusted in response to the orientation direction of the magnetization of the first ferromagnetic layer 1 and the magnetization of the second ferromagnetic layer 2 in an initial state to be described later.

For example, when the spacer layer 3 is made of an insulator, the magnetic element 10 has a magnetic tunnel junction (MTJ) composed of the first ferromagnetic layer 1, the spacer layer 3, and the second ferromagnetic layer 2. Such an element is referred to as an MTJ element. In this case, the magnetic element 10 can exhibit a tunnel magnetoresistance (TMR) effect. For example, when the spacer layer 3 is made of metal, the magnetic element 10 can exhibit a giant magnetoresistance (GMR) effect. Such an element is referred to as a GMR element.

When the spacer layer 3 is made of an insulating material, a material containing aluminum oxide, magnesium oxide, titanium oxide, silicon oxide, and the like can be used. Further, these insulating materials may contain elements such as Al, B, Si, and Mg and magnetic elements such as Co, Fe, and Ni. A high magnetic resistance change rate can be obtained by adjusting the film thickness of the spacer layer 3 so that a high TMR effect is exhibited between the first ferromagnetic layer 1 and the second ferromagnetic layer 2. In order to efficiently utilize the TMR effect, the film thickness of the spacer layer 3 may be about 0.5 to 5.0 nm or about 1.0 to 2.5 nm.

When the spacer layer 3 is made of a non-magnetic conductive material, a conductive material such as Cu, Ag, Au, and Ru can be used. In order to efficiently utilize the GMR effect, the film thickness of the spacer layer 3 may be about 0.5 to 5.0 nm or about 2.0 to 3.0 nm.

When the spacer layer 3 is made of a non-magnetic semiconductor material, a material such as zinc oxide, indium oxide, tin oxide, germanium oxide, gallium oxide, and ITO can be used. In this case, the film thickness of the spacer layer 3 may be about 1.0 to 4.0 nm.

When applying a layer including an energizing point composed of a conductor in a non-magnetic insulator as the spacer layer 3, a structure may include an energizing point composed of a non-magnetic conductor such as Cu, Au, and Al in a non-magnetic insulator composed of aluminum oxide or magnesium oxide. Further, the conductor may be composed of magnetic elements such as Co, Fe, and Ni. In this case, the film thickness of the spacer layer 3 may be about 1.0 to 2.5 nm. The energizing point is, for example, a columnar body having a diameter of 1 nm or more and 5 nm or less when viewed from a direction perpendicular to the film surface.

As described above, the magnetic element 10 may be differently referred to as an MTJ element, a GMR element, or the like depending on the constituent material of the spacer layer 3, but is also collectively referred to as a magnetoresistance effect element.

In addition to this, the magnetic element 10 may include a base layer, a cap layer, a perpendicular magnetization induced layer, and the like. The base layer is below the second ferromagnetic layer 2. The base layer is a seed layer or a buffer layer. The seed layer enhances the crystallinity of the layer laminated on the seed layer. The seed layer is, for example, Pt, Ru, Hf, Zr, or NiFeCr. The film thickness of the seed layer is, for example, 1 nm or more and 5 nm or less. The buffer layer is a layer that alleviates lattice mismatch between different crystals. The buffer layer is, for example, Ta, Ti, W, Zr, Hf, or a nitride of these elements. The film thickness of the buffer layer is, for example, 1 nm or more and 5 nm or less.

The cap layer is above the first ferromagnetic layer 1. The cap layer prevents damage to the lower layer during the process and enhances the crystallinity of the lower layer during annealing. The film thickness of the cap layer is, for example, 3 nm or less so that the first ferromagnetic layer 1 is sufficiently irradiated with light. The cap layer is, for example, MgO, W, Mo, Ru, Ta, Cu, Cr, or a laminated film thereof.

The perpendicular magnetization induced layer is formed when the first ferromagnetic layer 1 is the perpendicular magnetization film. The perpendicular magnetization induced layer is laminated on the first ferromagnetic layer 1. The perpendicular magnetization induced layer induces the vertical magnetic anisotropy of the first ferromagnetic layer 1. The perpendicular magnetization induced layer is, for example, magnesium oxide, W, Ta, Mo, or the like. When the perpendicular magnetization induced layer is magnesium oxide, magnesium oxide may be oxygen-deficient in order to enhance conductivity. The film thickness of the perpendicular magnetization induced layer is, for example, 0.5 nm or more and 2.0 nm or less.

Further, the light detection element 200 may further include a first electrode and a second electrode connected to each of the magnetic elements 10. The first electrode contacts a first surface (irradiation surface) of the magnetic element 10. The first surface is a surface on the side of the first ferromagnetic layer 1 of the magnetic element 10 in the z direction. The second electrode contacts a second surface of the magnetic element 10. The second surface is a surface on the side of the second ferromagnetic layer 2 of the magnetic element 10 in the z direction. The first electrode and the second electrode sandwich, for example, the magnetic element 10 in the z direction.

The first electrode and the second electrode are made of a conductive material. The first electrode and the second electrode are made of, for example, metal such as Cu, Al, Au, and Ru. Ta or Ti may be laminated above and below these metals. Further, as the first electrode and the second electrode, a laminated film of Cu and Ta, a laminated film of Ta, Cu, and Ti, or a laminated film of Ta, Cu, and TaN may be used. Further, as the first electrode and the second electrode, TiN or TaN may be used.

The first electrode and the second electrode may have transparency in the wavelength range of the light applied to the magnetic element 10. For example, the first electrode and the second electrode may be transparent electrodes containing transparent electrode materials of oxides such as indium tin oxide (ITO), zinc oxide (IZO), zinc oxide (ZnO), and indium gallium zinc oxide (IGZO). Further, the first electrode and the second electrode may be configured to have a plurality of columnar metals in these transparent electrode materials.

The magnetic element 10 is manufactured, for example, by a laminating step, an annealing step, and a processing step of each layer. Each layer is formed by, for example, sputtering. Annealing is performed, for example, at 250° C. or higher and 450° C. or lower. The processing of the laminated film is performed by using, for example, photolithography and etching. The laminated film becomes a columnar magnetic element 10. The magnetic element 10 may be a cylinder or a prism. For example, the shortest width of the magnetic element 10 when viewed from the z direction may be 10 nm or more and 2000 nm or less, or 30 nm or more and 500 nm or less. By the above-described steps, the magnetic element 10 is obtained.

FIG. 3 shows an example of the magnetic element 10, but the magnetic element may include a strong magnetic material of which a magnetization state changes by the application of light and a resistance value changes in accordance with a change in the magnetization state. As the magnetic element, for example, an anisotropic magnetoresistance (AMR) effect element, a colossal magnetoresistance (CMR) effect element, or the like can be used in addition to the above-described MTJ element and GMR element.

Next, some examples of the operation of the magnetic element 10 will be described. The first ferromagnetic layer 1 is irradiated with light whose light intensity changes. The resistance value of the magnetic element 10 in the z direction changes when the first ferromagnetic layer 1 is irradiated with light. The voltage output from the magnetic element 10 changes when the first ferromagnetic layer 1 is irradiated with light. In the first operation example, a case in which the intensity of the light applied to the first ferromagnetic layer 1 has two stages of the first intensity and the second intensity will be described as an example. The intensity of the light of the second intensity is larger than the intensity of the light of the first intensity. The first intensity may be a case in which the intensity of the light applied to the first ferromagnetic layer 1 is zero.

Figures 5, 6:
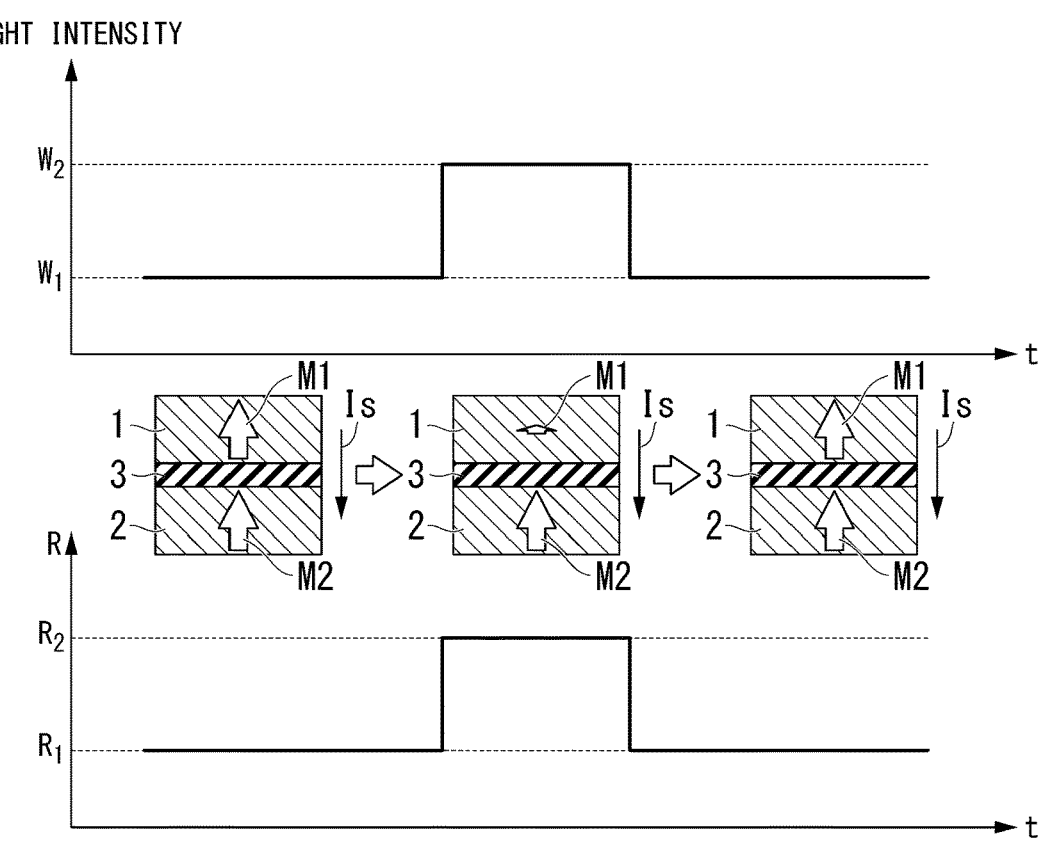
FIG. 5 is a diagram illustrating a second mechanism of the first operation example of the magnetic element according to the first embodiment.
FIG. 6 is a diagram illustrating a first mechanism of a second operation example of the magnetic element according to the first embodiment.

FIGS. 4 and 5 are diagrams illustrating a first operation example of the magnetic element 10 according to the first embodiment. FIG. 4 is a diagram illustrating a first mechanism of the first operation example and FIG. 5 is a diagram illustrating a second mechanism of the first operation example. In the upper graph of FIGS. 4 and 5, the vertical axis is the intensity of the light applied to the first ferromagnetic layer 1 and the horizontal axis is the time. In the lower graph of FIGS. 4 and 5, the vertical axis is the resistance value of the magnetic element 10 in the z direction and the horizontal axis is the time.

First, in a state in which the first ferromagnetic layer 1 is irradiated with the light of the first intensity (hereinafter, referred to as an initial state), the magnetization M1 of the first ferromagnetic layer 1 and the magnetization M2 of the second ferromagnetic layer 2 have a parallel relationship and the resistance value of the magnetic element 10 in the z direction indicates a first resistance value $R_1$. The resistance value of the magnetic element 10 in the z direction can be obtained by Ohm's law from a voltage value when a voltage is generated across both ends of the magnetic element 10 in the z direction when a sense current Is flows through the magnetic element 10 in the z direction. The voltage output from the magnetic element 10 is generated between the first electrode and the second electrode. In the case of the example shown in FIG. 4, the sense current Is flows from the first ferromagnetic layer 1 toward the second ferromagnetic layer 2. When the sense current Is flows in this direction, a spin transfer torque acts on the magnetization M1 of the first ferromagnetic layer 1 in the same direction as the magnetization M2 of the second ferromagnetic layer 2 and the magnetization M1 and the magnetization M2 are parallel in the initial state. Further, it is possible to prevent the magnetization M1 of the first ferromagnetic layer 1 from being inverted during operation by flowing the sense current Is in this direction.

Next, the intensity of the light applied to the first ferromagnetic layer 1 changes from the first intensity to the second intensity. The second intensity is larger than the first intensity and the magnetization M1 of the first ferromagnetic layer 1 changes from the initial state. The state of the magnetization M1 of the first ferromagnetic layer 1 in a state in which the first ferromagnetic layer 1 is not irradiated with light is different from the state of the magnetization M1 of the first ferromagnetic layer 1 in the second intensity. The state of the magnetization M1 is, for example, an inclination angle, a magnitude, or the like with respect to the z direction.

For example, as shown in FIG. 4, when the intensity of the light applied to the first ferromagnetic layer 1 changes from the first intensity to the second intensity, the magnetization M1 is inclined with respect to the z direction. Further, for example, as shown in FIG. 5, when the intensity of the light applied to the first ferromagnetic layer 1 changes from the first intensity to the second intensity, the magnitude of the magnetization M1 becomes small. For example, when the magnetization M1 of the first ferromagnetic layer 1 is inclined with respect to the z direction by the intensity of the applied light, the inclination angle is larger than 0° and smaller than 90°.

When the magnetization M1 of the first ferromagnetic layer 1 changes from the initial state, the resistance value of the magnetic element 10 in the z direction indicates a second resistance value $R_2$. The second resistance value $R_2$ is larger than the first resistance value $R_1$. The second resistance value $R_2$ is between the resistance value (first resistance value $R_1$) when the magnetization M1 and the magnetization M2 are parallel and the resistance value when the magnetization M1 and the magnetization M2 are antiparallel.

In the case shown in FIG. 4, a spin transfer torque acts on the magnetization M1 of the first ferromagnetic layer 1 in the same direction as the magnetization M2 of the second ferromagnetic layer 2. Thus, when the magnetization M1 tries to return to the parallel state with the magnetization M2 and the intensity of the light applied to the first ferromagnetic layer 1 changes from the second intensity to the first intensity, the magnetic element 10 returns to the initial state. In the case shown in FIG. 5, when the intensity of the light applied to the first ferromagnetic layer 1 returns to the first intensity, the magnitude of the magnetization M1 of the first ferromagnetic layer 1 returns to the original state and the magnetic element 10 returns to the initial state. In any case, the resistance value of the magnetic element 10 in the z direction returns to the first resistance value $R_1$. That is, when the intensity of the light applied to the first ferromagnetic layer 1 changes from the second intensity to the first intensity, the resistance value of the magnetic element 10 in the z direction changes from the second resistance value $R_2$ to the first resistance value $R_1$.

The resistance value of the magnetic element 10 in the z direction changes in response to a change in the intensity of the light applied to the first ferromagnetic layer 1. The voltage output from the magnetic element 10 changes in response to a change in the intensity of the light applied to the first ferromagnetic layer 1. That is, the magnetic element 10 can convert a change in the intensity of the applied light into a change in the output voltage. That is, the magnetic element 10 can convert light into an electric signal. For example, a process is performed by outputting a first signal (for example, "1") when the voltage output from the magnetic element 10 is equal to or larger than a threshold value and outputting a second signal (for example, "0") when the voltage is smaller than the threshold value.

Here, a case in which the magnetization M1 and the magnetization M2 are parallel in the initial state has been described as an example, but the magnetization M1 and the magnetization M2 may be antiparallel in the initial state. In this case, the resistance value of the magnetic element 10 in the z direction becomes smaller as the state of the magnetization M1 changes (for example, the angle change of the magnetization M1 from the initial state becomes larger). When a case in which the magnetization M1 and the magnetization M2 are antiparallel is the initial state, the sense current Is may flow from the second ferromagnetic layer 2 toward the first ferromagnetic layer 1. When the sense current Is flows in this direction, a spin transfer torque acts on the magnetization M1 of the first ferromagnetic layer 1 in the direction opposite to the magnetization M2 of the second ferromagnetic layer 2 and the magnetization M1 and the magnetization M2 are antiparallel in the initial state.

In the first operation example, a case in which the light applied to the first ferromagnetic layer 1 has two stages of the first intensity and the second intensity has been described as an example, but in the second operation example, a case in which the intensity of the light applied to the first ferromagnetic layer 1 changes in multiple stages or in an analog manner will be described.

Figure 7:
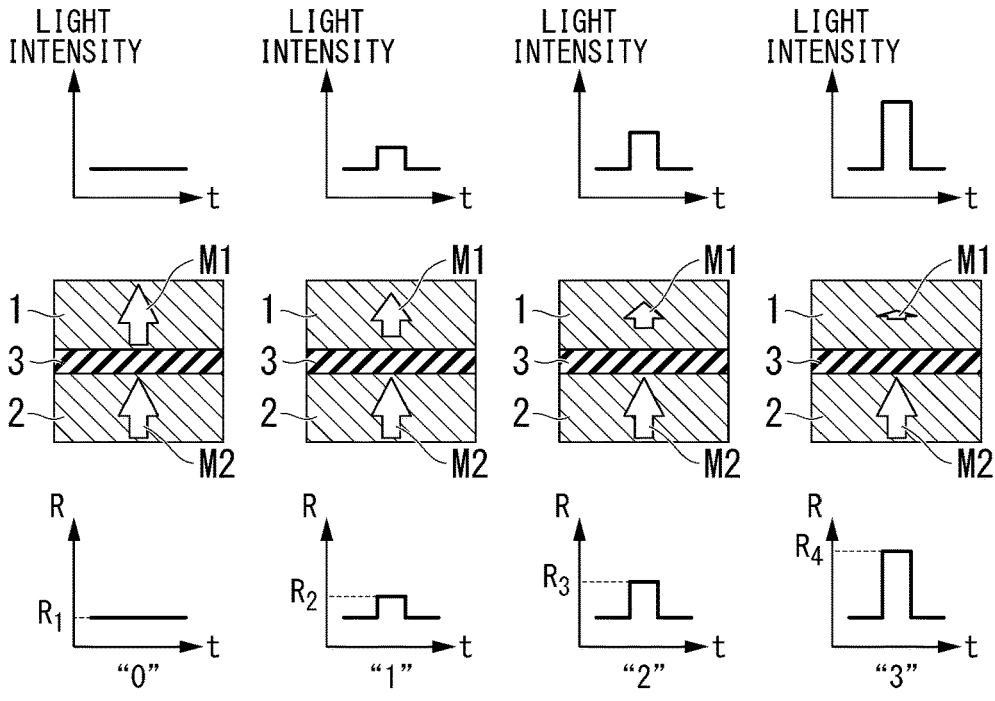
FIG. 7 is a diagram illustrating a second mechanism of the second operation example of the magnetic element according to the first embodiment.

FIGS. 6 and 7 are diagrams illustrating a second operation example of the magnetic element 10 according to the first embodiment. FIG. 6 is a diagram illustrating a first mechanism of the second operation example and FIG. 7 is a diagram illustrating a second mechanism of the second operation example. In the upper graph of FIGS. 6 and 7, the vertical axis is the intensity of the light applied to the first ferromagnetic layer 1 and the horizontal axis is the time. In the lower graph of FIGS. 6 and 7, the vertical axis is the resistance value of the magnetic element 10 in the z direction and the horizontal axis is the time.

In the case of FIG. 6, when the intensity of the light applied to the first ferromagnetic layer 1 becomes large, the magnetization M1 of the first ferromagnetic layer 1 is inclined from the initial state by the external energy according to the application of light. An angle between a direction of the magnetization M1 of the first ferromagnetic layer 1 when the first ferromagnetic layer 1 is not irradiated with light and a direction of the magnetization M1 when the first ferromagnetic layer 1 is irradiated with light is larger than 0° and smaller than 90°.

When the magnetization M1 of the first ferromagnetic layer 1 is inclined from the initial state, the resistance value of the magnetic element 10 in the z direction changes. For example, the resistance value of the magnetic element 10 in the z direction changes to the second resistance value $R_2$, a third resistance value $R_3$, and a fourth resistance value $R_4$ in response to the inclination of the magnetization M1 of the first ferromagnetic layer 1. The resistance value becomes larger in order of the first resistance value $R_1$, the second resistance value $R_2$, the third resistance value $R_3$, and the fourth resistance value $R_4$. That is, the voltage output from the magnetic element 10 changes from the first voltage value to the second voltage value, the third voltage value, and the fourth voltage value in response to the inclination of the magnetization M1 of the first ferromagnetic layer 1. The output voltage becomes larger in order of the first voltage value, the second voltage value, the third voltage value, and the fourth voltage value.

The resistance value of the magnetic element 10 in the z direction changes when the intensity of the light applied to the first ferromagnetic layer 1 changes. The voltage output from the magnetic element 10 changes when the intensity of the light applied to the first ferromagnetic layer 1 changes. For example, when the first voltage value is defined as "0", the second voltage value is defined as "1", the third voltage value is defined as "2", and the fourth voltage value is defined as "3", the magnetic element 10 can output four-value information. Here, a case of reading four values is shown as an example, but the number of values to be read can be freely designed by setting the threshold value of the output voltage. Further, the magnetic element 10 may directly output an analog value.

Similarly, in the case of FIG. 7, the magnitude of the magnetization M1 of the first ferromagnetic layer 1 becomes small from the initial state by the external energy according to the application of light when the intensity of the light applied to the first ferromagnetic layer 1 becomes large. When the magnetization M1 of the first ferromagnetic layer 1 becomes small from the initial state, the resistance value of the magnetic element 10 in the z direction changes. For example, the resistance value of the magnetic element 10 in the z direction changes to the second resistance value $R_2$, the third resistance value $R_3$, and the fourth resistance value $R_4$ in response to the magnitude of the magnetization M1 of the first ferromagnetic layer 1. That is, the voltage output from the magnetic element 10 changes from the first voltage value to the second voltage value, the third voltage value, and the fourth voltage value in response to the magnitude of the magnetization M1 of the first ferromagnetic layer 1. Thus, as in the case of FIG. 6, the magnetic element 10 can output a difference between these output voltages as multi-value or analog data.

Further, also in the case of the second operation example, similarly to the case of the first operation example, when the intensity of the light applied to the first ferromagnetic layer 1 returns to the first intensity, the state of the magnetization M1 of the first ferromagnetic layer 1 returns to an original state and the magnetic element 10 returns to the initial state.

Here, a case in which the magnetization M1 and the magnetization M2 are parallel in the initial state has been described as an example, but also in the second operation example, the magnetization M1 and the magnetization M2 may be antiparallel in the initial state.

Further, in the first operation example and the second operation example, a case in which the magnetization M1 and the magnetization M2 are parallel or antiparallel in the initial state has been described as an example, but the magnetization M1 and the magnetization M2 may be orthogonal in the initial state. For example, a case in which the first ferromagnetic layer 1 is an in-plane magnetization film in which the magnetization M1 is oriented in any direction of the xy plane and the second ferromagnetic layer 2 is a perpendicular magnetization film in which the magnetization M2 is oriented in the z direction corresponds to this case. Since the magnetization M1 is oriented in any direction in the xy plane and the magnetization M2 is oriented in the z direction due to magnetic anisotropy, the magnetization M1 and the magnetization M2 are orthogonal in the initial state.

Figure 8:
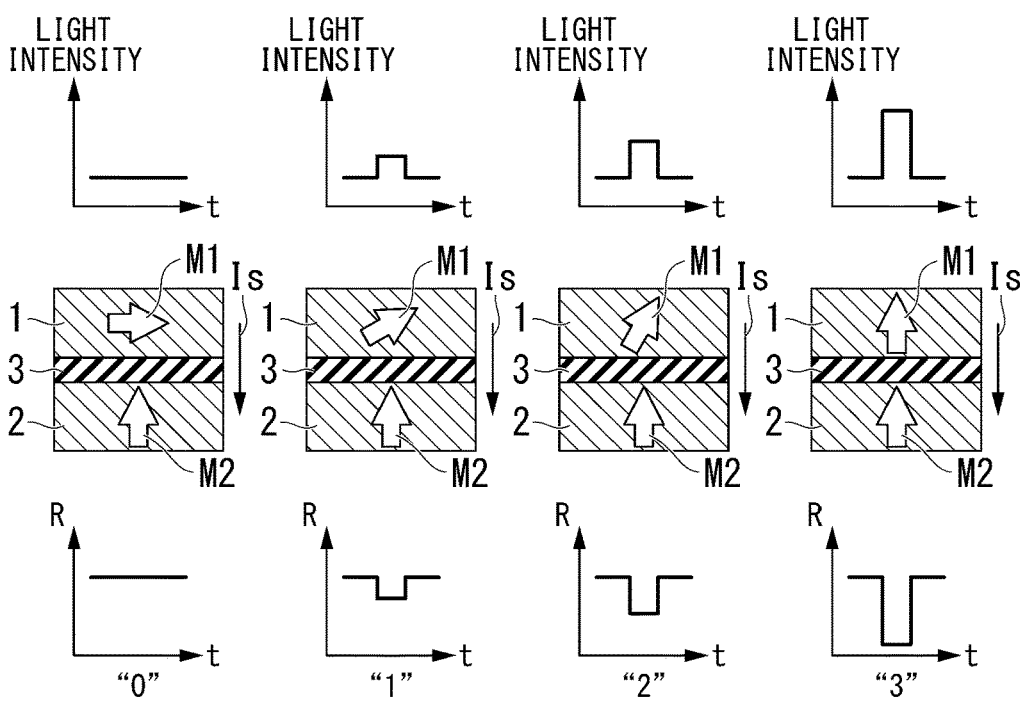
FIG. 8 is a diagram illustrating another example of the second operation example of the magnetic element according to the first embodiment.
Figure 9:
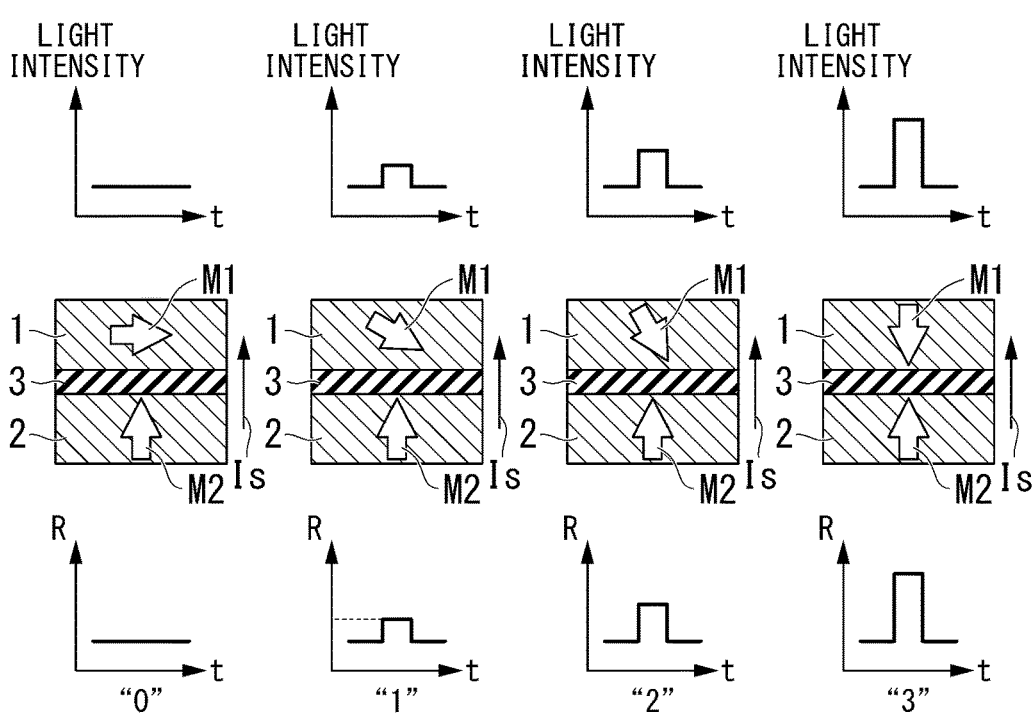
FIG. 9 is a diagram illustrating another example of the second operation example of the magnetic element according to the first embodiment.

FIGS. 8 and 9 are diagrams illustrating another example of the second operation example of the light detection element 200 according to the first embodiment. In FIGS. 8 and 9, the flow direction of the sense current Is applied to the magnetic element 10 is different. In FIG. 8, the sense current Is flows from the first ferromagnetic layer 1 toward the second ferromagnetic layer 2. In FIG. 9, the sense current Is flows from the second ferromagnetic layer 2 toward the first ferromagnetic layer 1.

In any case of FIGS. 8 and 9, since the sense current Is flows through the magnetic element 10, a spin transfer torque acts on the magnetization M1 in the initial state. In the case of FIG. 8, a spin transfer torque acts so that the magnetization M1 is parallel to the magnetization M2 of the second ferromagnetic layer 2. In the case of FIG. 9, a spin transfer torque acts so that the magnetization M1 is antiparallel to the magnetization M2 of the second ferromagnetic layer 2. In any case of FIGS. 8 and 9, since the action of the magnetic anisotropy on the magnetization M1 is larger than the action of the spin transfer torque in the initial state, the magnetization M1 faces any direction in the xy plane.

When the intensity of the light applied to the first ferromagnetic layer 1 becomes large, the magnetization M1 of the first ferromagnetic layer 1 is inclined from the initial state by the external energy according to the application of light. This is because the sum of the action applied to the magnetization M1 due to the application of light and the action applied to the magnetization M1 due to the spin transfer torque is larger than the action due to the magnetic anisotropy related to the magnetization M1. When the intensity of the light applied to the first ferromagnetic layer 1 becomes large, the magnetization M1 in the case of FIG. 8 is inclined to be parallel to the magnetization M2 of the second ferromagnetic layer 2 and the magnetization M1 in the case of FIG. 9 is inclined to be antiparallel to the magnetization M2 of the second ferromagnetic layer 2. Since the direction of the spin transfer torque acting on the magnetization M1 is different, the inclination direction of the magnetization M1 in FIGS. 8 and 9 is different.

When the intensity of the light applied to the first ferromagnetic layer 1 becomes large, the resistance value of the magnetic element 10 becomes small in the case of FIG. 8 and the resistance value of the magnetic element 10 becomes large in the case of FIG. 9. That is, when the intensity of the light applied to the first ferromagnetic layer 1 becomes large, the voltage output from the magnetic element 10 becomes small in the case of FIG. 8 and the output voltage of the magnetic element 10 becomes large in the case of FIG. 9.

When the intensity of the light applied to the first ferromagnetic layer 1 returns to the first intensity, the state of the magnetization M1 of the first ferromagnetic layer 1 returns to an original state due to the action of the magnetic anisotropy on the magnetization M1. As a result, the magnetic element 10 returns to the initial state.

Here, an example in which the first ferromagnetic layer 1 is the in-plane magnetization film and the second ferromagnetic layer 2 is the perpendicular magnetization film has been described, but this relationship may be reversed. That is, in the initial state, the magnetization M1 may be oriented in the z direction and the magnetization M2 may be oriented in any direction in the xy plane.

In the light detection element 200 according to the first embodiment, the magnetic elements 10 are in the same spot sp. The magnetic elements 10 behave in the same manner with respect to the light L. The light detection element 200 can combine the outputs from the magnetic elements 10 that behave similarly to the light L. Further, in the light detection element 200, the magnetic elements 10 simultaneously receive the same optical signal. Therefore, the light detection element 200 can suppress noise with respect to the output signal. Thus, the light detection element 200 according to the first embodiment has a large SN ratio.

Although the first embodiment has been described in detail with reference to the drawings, the first embodiment is not limited to this example.

Figure 10:
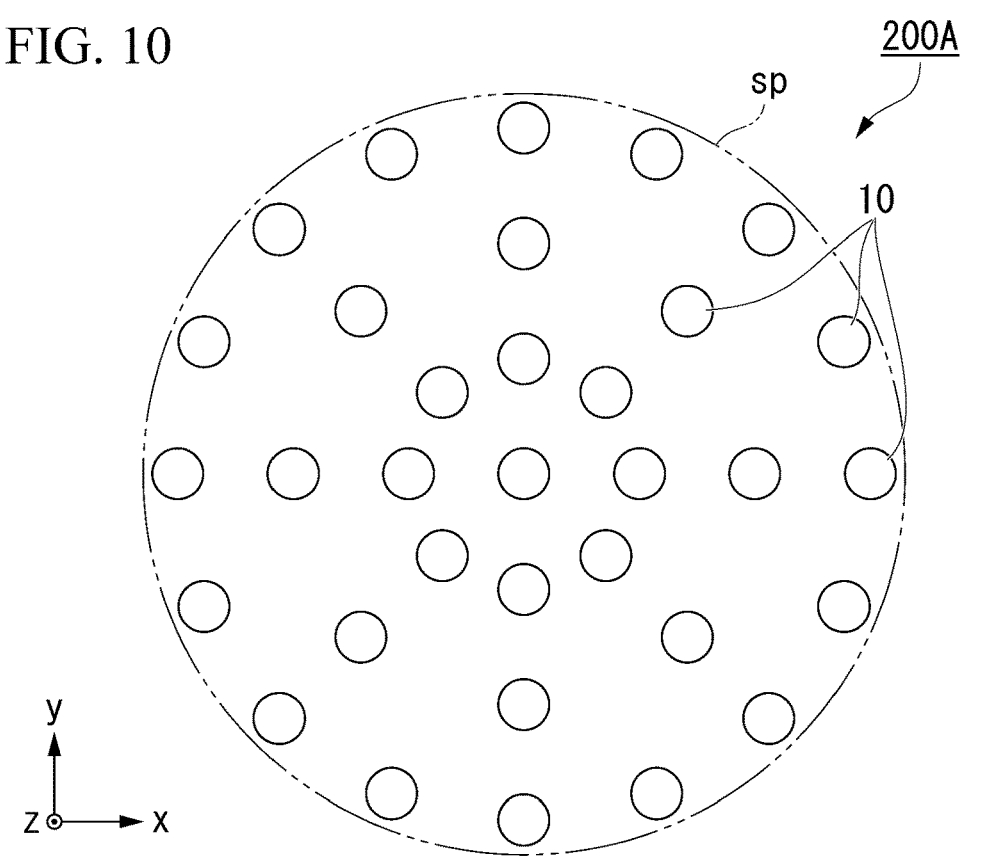
FIG. 10 is a plan view of a light detection element according to a first modified example of the first embodiment.
Figure 11:
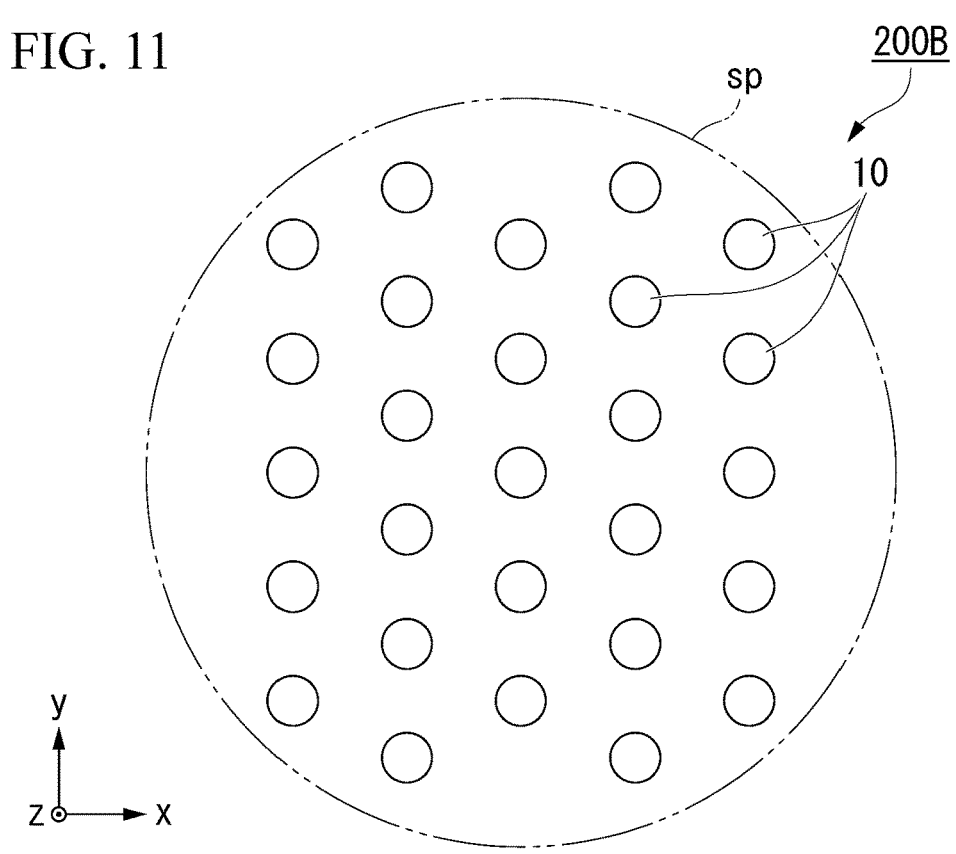
FIG. 11 is a plan view of a light detection element according to a second modified example of the first embodiment.

For example, the magnetic elements 10 may be arranged concentrically inside the spot sp as in a light detection element 200A shown in FIG. 10. Further, for example, as in a light detection element 200B shown in FIG. 11, the magnetic elements 10 may be arranged in a triangular lattice pattern inside the spot sp. The arrangement of the magnetic elements 10 is not limited to these cases, and various arrangements such as a hexagonal lattice can be selected.

Figure 12:
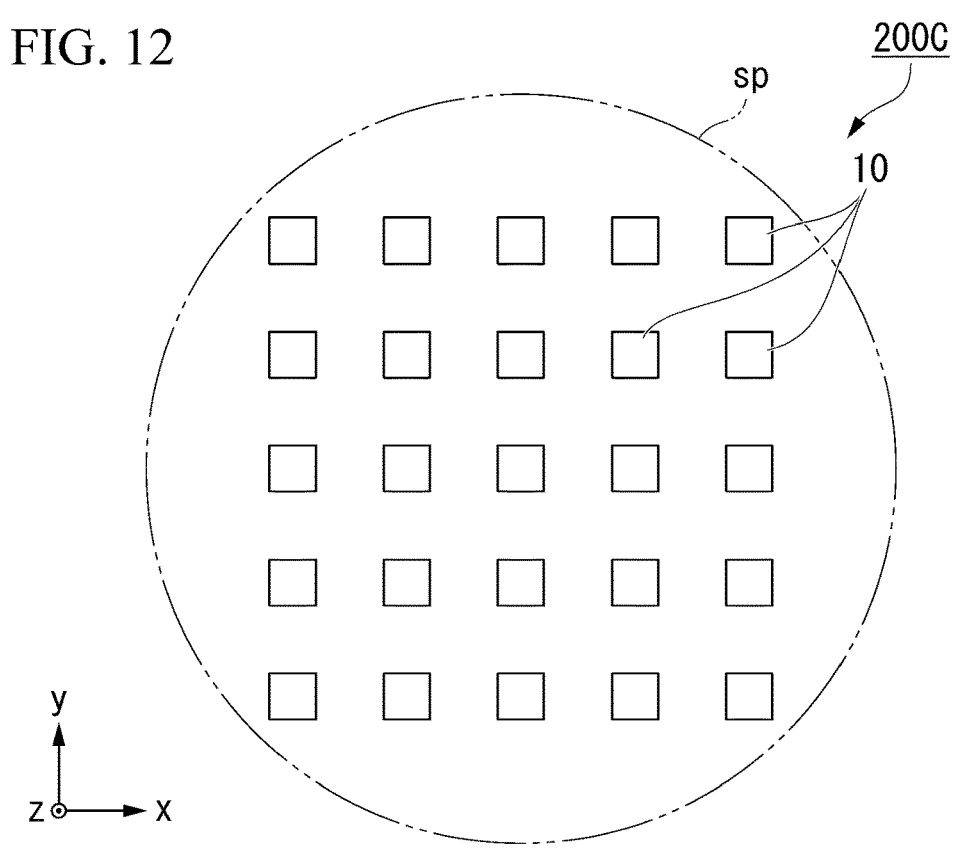
FIG. 12 is a plan view of a light detection element according to a third modified example of the first embodiment.

Further, for example, each of the magnetic elements 10 may have a rectangular shape in a plan view as in a light detection element 200C shown in FIG. 12.

Second Embodiment

Figure 13:
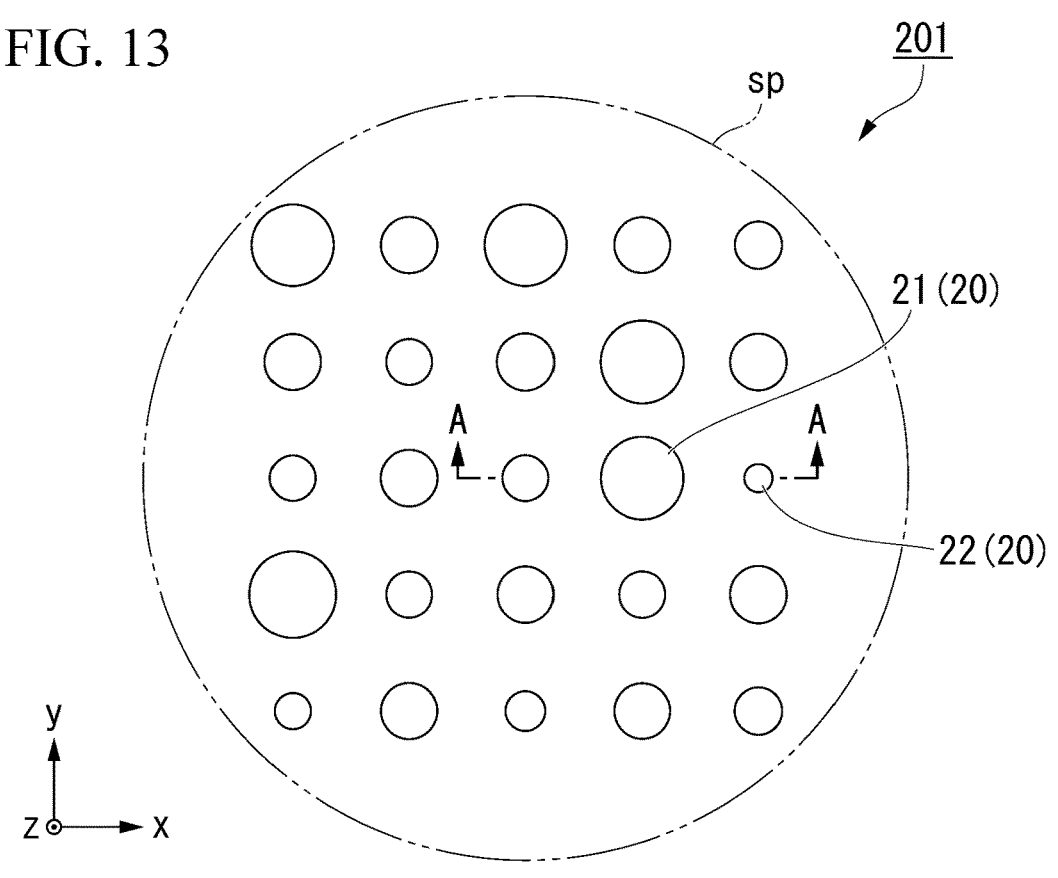
FIG. 13 is a plan view of a light detection element according to a second embodiment.

FIG. 13 is a plan view in which a light detection element 201 according to a second embodiment is viewed from the z direction. In the second embodiment, the same configurations as those of the first embodiment are designated by the same reference numerals, and the description thereof will be omitted.

The light detection element 201 includes a plurality of magnetic elements 20. The magnetic elements 20 are arranged to be inside the spot sp of the applied light L.

Figure 14:
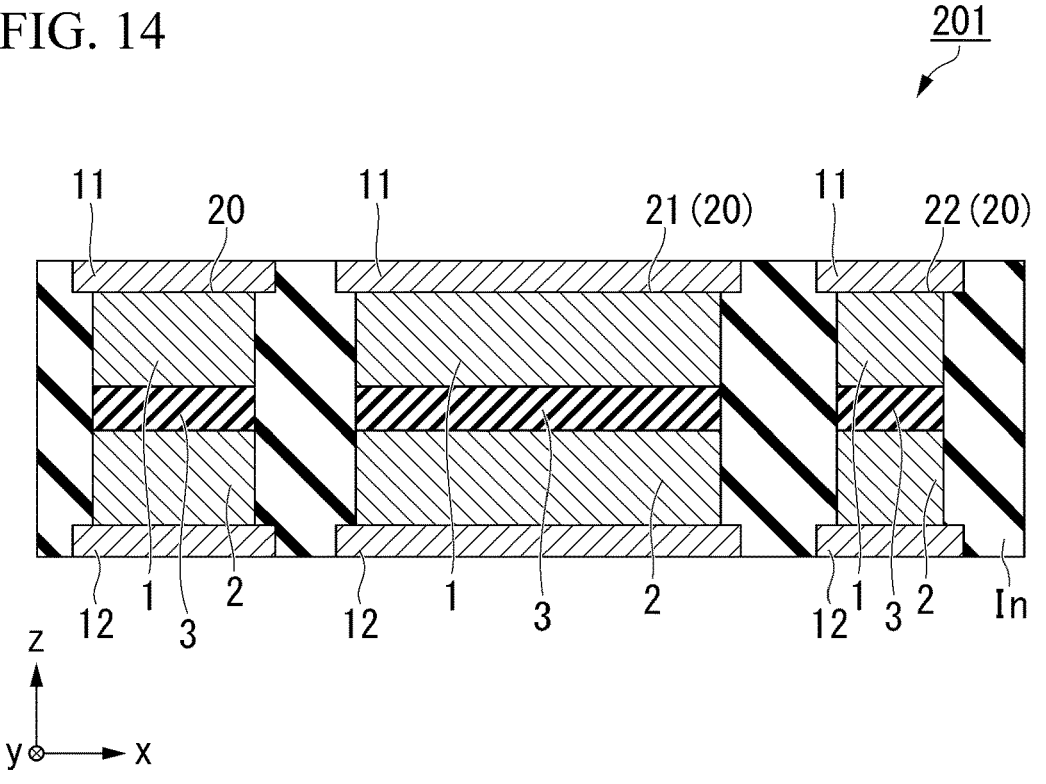
FIG. 14 is a cross-sectional view of a part of the light detection element according to the second embodiment.

The magnetic elements 20 include a first magnetic element 21 and a second magnetic element 22. The first magnetic element 21 and the second magnetic element 22 are arranged to be inside the spot sp of the applied light L. For example, the first magnetic element 21 and the second magnetic element 22 are electrically connected in series or in parallel. FIG. 14 is a cross-sectional view of the light detection element 201 according to the second embodiment. FIG. 14 shows a cross-section taken along the line A-A of FIG. 13. Each of the magnetic elements 20 has a layer structure similar to that of the magnetic element 10. In FIG. 14, a first electrode 11 and a second electrode 12 connected to each of the magnetic element 20 and an insulating layer In covering the periphery of the magnetic element 20 are simultaneously shown. The material of the insulating layer In is, for example, an oxide, a nitride, or an oxynitride containing one or more metal elements or metalloid elements. More specifically, the material of the insulating layer In is, for example, oxide, nitride, or oxynitride containing one or more elements selected from the group consisting of Al, Si, Ta, In, Hf, Sn, Zn, Ti, Cu, Ce, Zr, Nb, Mg, B, Pb, Ca, La, and Ge.

The volume of the first ferromagnetic layer 1 is different between the first magnetic element 21 and the second magnetic element 22. The volume of the first ferromagnetic layer 1 of the first magnetic element 21 is larger than that of the second magnetic element 22. Since the volume of the first ferromagnetic layer 1 is different between the first magnetic element 21 and the second magnetic element 22, the sensitivity to the applied light is different. Since the degree of the change in the state of the magnetization M1 of the first ferromagnetic layer 1 with respect to the change in the intensity of the applied light becomes larger as the volume of the first ferromagnetic layer 1 becomes smaller, the sensitivity of the magnetic element 20 to the applied light becomes larger as the volume of the first ferromagnetic layer 1 becomes smaller.

In the example shown in FIG. 14, since the area of the first ferromagnetic layer 1 when viewed from the z direction is different, the volume of the first ferromagnetic layer 1 is different between the first magnetic element 21 and the second magnetic element 22. In the example shown in FIG. 14, the thickness of the first ferromagnetic layer 1 is the same between the first magnetic element 21 and the second magnetic element 22. The volume of the first ferromagnetic layer 1 is not limited to the area when viewed from the z direction and may be different by allowing the thickness of the first ferromagnetic layer 1 to be different. Further, in the magnetic elements 20, the volume of the first ferromagnetic layer 1 may be different in any one of the first magnetic element 21 and the second magnetic element 22. In the example shown in FIG. 14, the first magnetic element 21 and the second magnetic element 22 are arranged at a position in which the distances from the center of the spot sp (the distance between the center of the spot sp and the center of each magnetic element in a plan view from the z direction) are different, the first magnetic element 21 and the second magnetic element 22 may be arranged at a position in which the distance from the center of the spot sp is the same.

Figure 15:
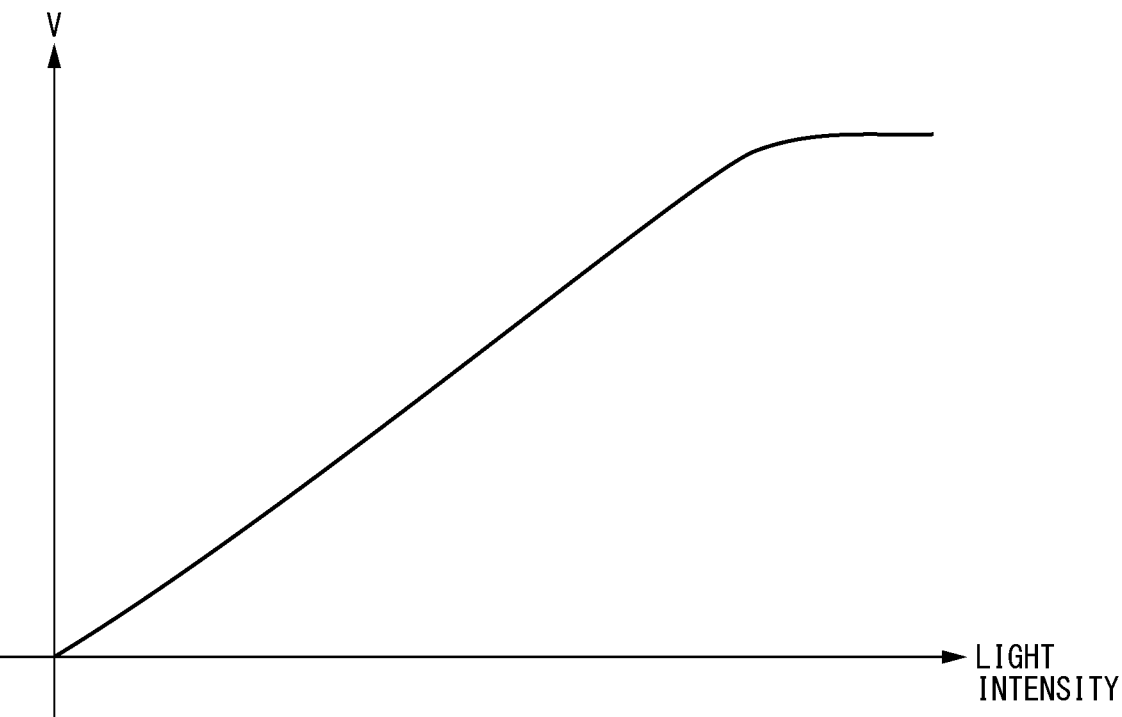
FIG. 15 shows a change in the output voltage of a first magnetic element with respect to light intensity.
Figure 16:
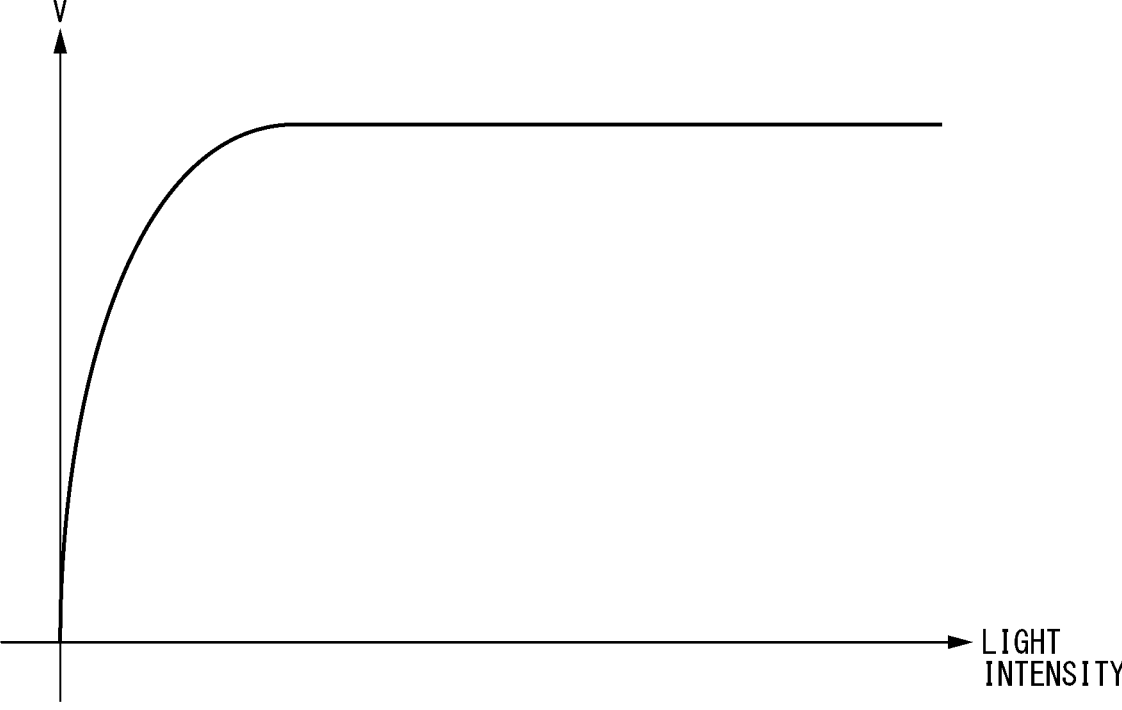
FIG. 16 shows a change in the output voltage of a second magnetic element with respect to light intensity.

FIG. 15 shows a change in the voltage output from the first magnetic element 21 with respect to the intensity of the applied light. FIG. 16 shows a change in the voltage output from the second magnetic element 22 with respect to the intensity of the applied light.

As shown in FIG. 16, the resistance value largely changes in a low-intensity region in which the intensity of the light L is small in the second magnetic element 22 of which the volume of the first ferromagnetic layer 1 is relatively small. That is, the output voltage of the second magnetic element 22 changes significantly in the low-intensity region of the light L and the sensitivity to the light L is relatively high. On the other hand, since the second magnetic element 22 quickly reaches the maximum resistance value, there is little change in the resistance value in a high-intensity region in which the intensity of the light L is large. That is, in the second magnetic element 22, there is a little change in the output voltage with respect to a change in the intensity of the light L in the high-intensity region of the light L and it is difficult to detect a change in the intensity of the light L. Thus, the second magnetic element 22 has a relatively high sensitivity to the light, but has a relatively narrow range in which a change in the intensity of the light L can be detected.

On the other hand, as shown in FIG. 15, there is a small change in the resistance value in the low-intensity region in which the intensity of the light L is small in the first magnetic element 21 in which the volume of the first ferromagnetic layer 1 is relatively large. That is, the output voltage of the first magnetic element 21 changes slowly and the sensitivity to the light L is relatively low in the low-intensity region of the light L. On the other hand, since the resistance value of the first magnetic element 21 is less likely to be saturated, the resistance value changes with a sufficient magnitude even in the high-intensity region in which the intensity of the light L is large. That is, the first magnetic element 21 can obtain a change in the output voltage with respect to a change in the intensity of the light L and detect a change in the intensity of the light L even in the high-intensity region of the light L. Thus, the first magnetic element 21 has a relatively low sensitivity to the light L and has a relatively wide range in which a change in the intensity of the light L can be detected.

Figure 17:
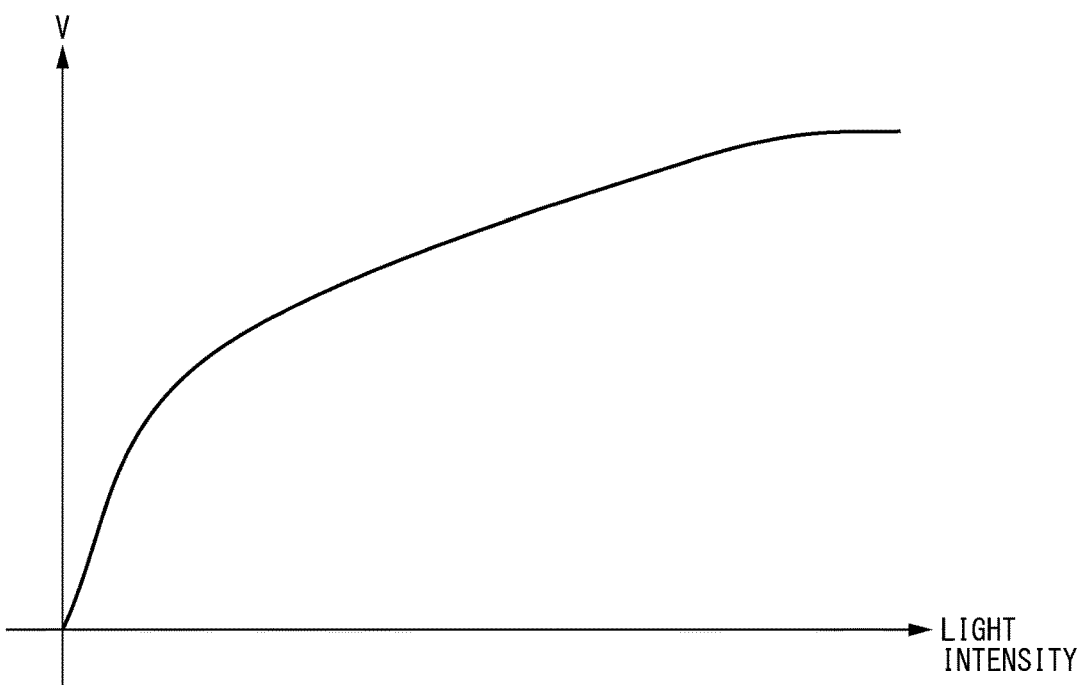
FIG. 17 shows a change in the combined output voltage of the first magnetic element and the second magnetic element with respect to light intensity.

FIG. 17 shows a change in the combined output voltage of the first magnetic element 21 and the second magnetic element 22 with respect to the intensity of the light L. For example, the combined output voltage is obtained by adding the output voltage of the first magnetic element 21 and the output voltage of the second magnetic element 22. Thus, the combined output voltage shows a large change in the value in the low-intensity region of the light L and a sufficiently large change in the value even in the high-intensity region of the light L. That is, the light detection element 201 including the first magnetic element 21 and the second magnetic element 22 have a high sensitivity to the light L in the low-intensity region of the light L and can detect a change in the intensity of the light L in a wide light intensity range.

Third Embodiment

Figure 18:
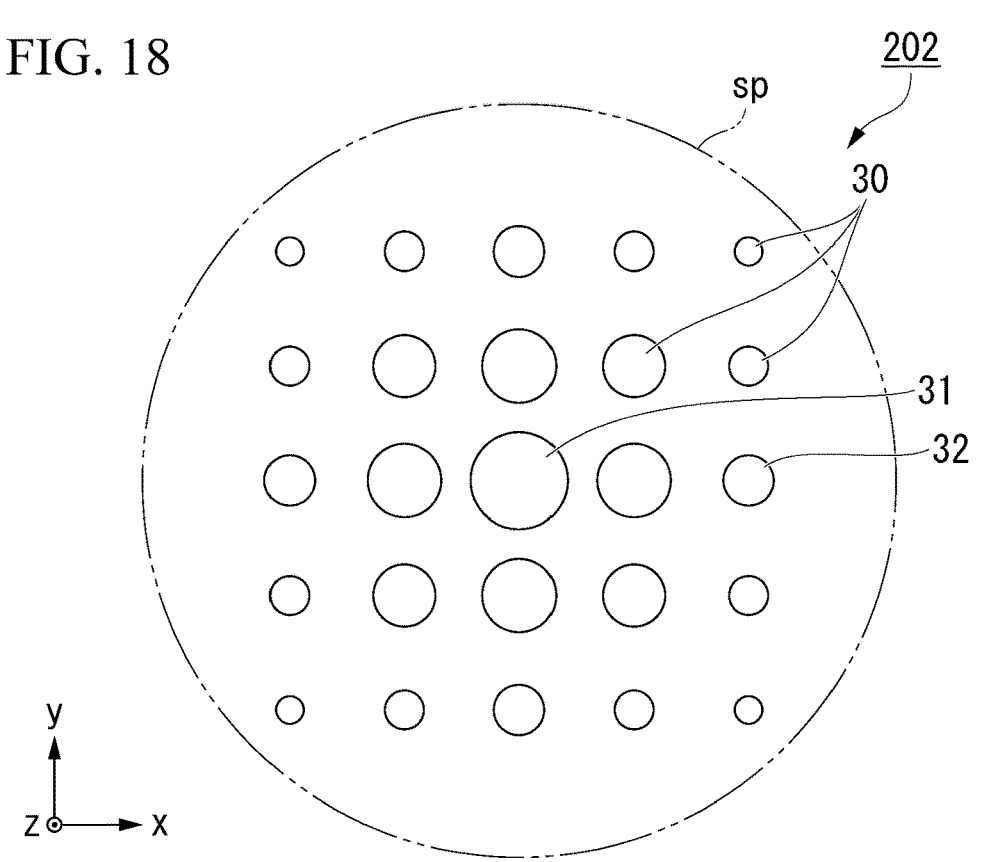
FIG. 18 is a plan view of a light detection element according to a third embodiment.

FIG. 18 is a plan view in which a light detection element 202 according to a third embodiment is viewed from the z direction. In the third embodiment, the same configurations as those of the first embodiment are designated by the same reference numerals, and the description thereof will be omitted.

The light detection element 202 includes a plurality of magnetic elements 30. The magnetic elements 30 are arranged to be inside the spot sp of the applied light L.

Each of the magnetic elements 30 has a layer structure similar to that of the magnetic element 10. In the example shown in FIG. 18, the volume of the first ferromagnetic layer 1 of the magnetic element 30 becomes larger toward the magnetic element 30 close to the center of the spot sp and becomes smaller toward the magnetic element 30 away from the center. That is, in a plan view from the z direction, the volume of the first ferromagnetic layer 1 becomes larger toward the magnetic element 30 having a short distance between its center and the center of the spot sp and the volume of the first ferromagnetic layer 1 becomes smaller toward the magnetic element 30 having a long distance between its center and the center of the spot sp. Hereinafter, expressions such as "close to or far from the center of the spot" and "on the side of the center of the spot or away from the center of the spot" show the distance between the center of the spot sp and the center of the magnetic element when viewed from the z direction. When a particular magnetic element is "close to the center of the spot" or "on the side of the center of the spot", the distance between the center of the particular magnetic element and the center of the spot sp is shorter than the distance between the center of the magnetic element as a comparison target and the center of the spot sp. Further, when a particular magnetic element is "far from the center of the spot" or "away from the center of the spot", the distance between the center of the particular magnetic element and the center of the spot sp is longer than the distance between the center of the magnetic element as a comparison target and the center of the spot sp.

For example, the magnetic elements 30 include a first magnetic element 31 and a second magnetic element 32. The first magnetic element 31 and the second magnetic element 32 are arranged to be inside the spot sp of the applied light L. For example, the first magnetic element 31 and the second magnetic element 32 are electrically connected in series or in parallel. The first magnetic element 31 is on the side of the center of the spot sp in relation to the second magnetic element 32. That is, the distance between the center of the rust magnetic element 31 and the center of the spot sp is shorter than the distance between the center of the second magnetic element 32 and the center of the spot sp in a plan view from the z direction. The volume of the first ferromagnetic layer 1 of the first magnetic element 31 is larger than the volume of the first ferromagnetic layer 1 of the second magnetic element 32. Since the volume of the first ferromagnetic layer 1 is different between the first magnetic element 31 and the second magnetic element 32, the sensitivity to the light L is different.

In the example shown in FIG. 18, since the area of the first ferromagnetic layer 1 when viewed from the z direction is different, the volume of the first ferromagnetic layer 1 is different between the first magnetic element 31 and the second magnetic element 32. In the example shown in FIG. 18, the thickness of the first ferromagnetic layer 1 is the same between the first magnetic element 31 and the second magnetic element 32. The volume of the first ferromagnetic layer 1 is not limited to the area when viewed from the z direction and may be different by allowing the thickness of the first ferromagnetic layer 1 to be different. Further, in the magnetic elements 30, the volume of the first ferromagnetic layer 1 may be different between the first magnetic element 31 and the second magnetic element 32.

The light intensity of the irradiation surface of each magnetic element 30 becomes larger toward the center of the spot sp. The output of the first magnetic element 31 having a relatively large volume of the first ferromagnetic layer 1 is less likely to be saturated even when it is irradiated with light having a higher intensity than that of the second magnetic element 32 (see FIGS. 15 and 16). Further, since the second magnetic element 32 having a relatively small volume of the first ferromagnetic layer 1 has higher sensitivity to light L than the first magnetic element 31 (see FIGS. 15 and 16), it is possible to obtain an output of a certain magnitude from the second magnetic element 32 even when the intensity of the applied light is smaller than that of the first magnetic element 31. In this way, since it is possible to effectively use both the output from the first magnetic element 31 and the output from the second magnetic element 32 in detecting the intensity of light in the light detection element 202 according to the third embodiment, the light detection element 202 according to the third embodiment has a large SN ratio.

Fourth Embodiment

Figure 19:
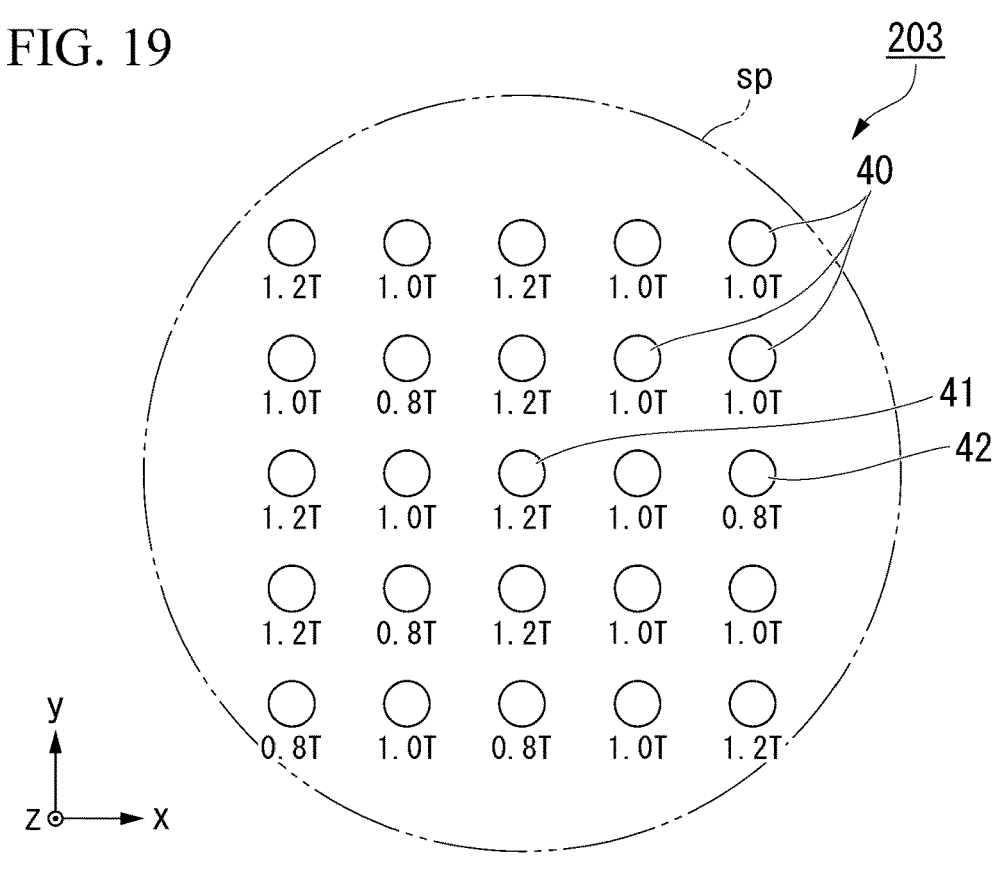
FIG. 19 is a plan view of a light detection element according to a fourth embodiment.

FIG. 19 is a plan view in which a light detection element 203 according to a fourth embodiment is viewed from the z direction. In the fourth embodiment, the same configurations as those of the first embodiment are designated by the same reference numerals, and the description thereof will be omitted.

The light detection element 203 includes a plurality of magnetic elements 40. The magnetic elements 40 are arranged to be inside the spot sp of the applied light L. Each of the magnetic elements 40 has a layer structure similar to that of the magnetic element 10.

The magnetic elements 40 include a first magnetic element 41 and a second magnetic element 42. The first magnetic element 41 and the second magnetic element 42 are arranged to be inside the spot sp of the applied light L.

For example, the first magnetic element 41 and the second magnetic element 42 are electrically connected in series or in parallel. The saturation magnetization of the first ferromagnetic layer 1 is different between the first magnetic element 41 and the second magnetic element 42. The saturation magnetization of the first ferromagnetic layer 1 of the first magnetic element 41 is larger than that of the second magnetic element 42. In the magnetic elements 40, there may be elements in which the saturation magnetization of the first ferromagnetic layer 1 is different between the first magnetic element 41 and the second magnetic element 42. In FIG. 19, an example of the saturation magnetization of each magnetic element 40 is written under each magnetic element 40. In the example shown in FIG. 19, the first magnetic element 41 and the second magnetic element 42 are arranged at a position in which the distance from the center of the spot sp (the distance between the center of the spot sp and the center of each magnetic element in a plan view) is different, but the first magnetic element 41 and the second magnetic element 42 may be arranged at the position in which the distance from the center of the spot sp is the same. The magnitude of the saturation magnetization of the first ferromagnetic layer 1 can be different by allowing the material forming the first ferromagnetic layer 1 to be different. For example, when the first ferromagnetic layer 1 is made of a CoFeB alloy, the saturation magnetization of the first ferromagnetic layer 1 can be large by increasing the ratio of Fe with respect to Co and the saturation magnetization of the first ferromagnetic layer 1 can be small by decreasing the ratio of Fe with respect to Co.

Since the saturation magnetization of the first ferromagnetic layer 1 is different between the first magnetic element 41 and the second magnetic element 42, the sensitivity to the applied light is different. Since the degree of the change in the state of the magnetization M1 of the first ferromagnetic layer 1 with respect to the change in the intensity of the applied light becomes larger as the saturation magnetization of the first ferromagnetic layer 1 becomes smaller, the sensitivity of the magnetic element 40 to the applied light becomes larger as the saturation magnetization of the first ferromagnetic layer 1 becomes smaller. Therefore, the first magnetic element 41 having a relatively large saturation magnetization of the first ferromagnetic layer 1 has a relatively low sensitivity to the light L and a relatively wide range in which a change in the intensity of the light L can be detected. The voltage output from the first magnetic element 41 shows the same behavior as that of the first magnetic element 21 shown in FIG. 15 with respect to the change in the intensity of the light L. The second magnetic element 42 having a relatively small saturation magnetization of the first ferromagnetic layer 1 has a relatively high sensitivity to the light L and a relatively narrow range in which a change in the light intensity can be detected. The voltage output from the second magnetic element 42 shows the same behavior as that of the second magnetic element 22 shown in FIG. 16 with respect to a change in the intensity of the light L. The combined output voltage of the first magnetic element 41 and the second magnetic element 42 shows the same behavior as that of the combined output voltage shown in FIG. 17 with respect to a change in the intensity of the light L.

Similarly to the light detection element 201 according to the second embodiment, the light detection element 203 including the first magnetic element 41 and the second magnetic element 42 has a high sensitivity to the light L in the low-intensity region of the light L and can detect a change in the intensity of the light L in a wide light intensity range.

Here, the light detection element 203 according to the fourth embodiment and the light detection element 201 according to the second embodiment are common in that the magnetic elements include elements having different sensitivities to the applied light. Thus, the sensitivity of a certain element in the magnetic elements to the applied light may be different from that of the other magnetic element by combining the characteristic configuration of the light detection element 201 and the characteristic configuration of the light detection element 203. Specifically, both the volume and the saturation magnetization of the first ferromagnetic layer 1 may be different in at least two magnetic elements arranged to be inside the spot sp.

Fifth Embodiment

Figure 20:
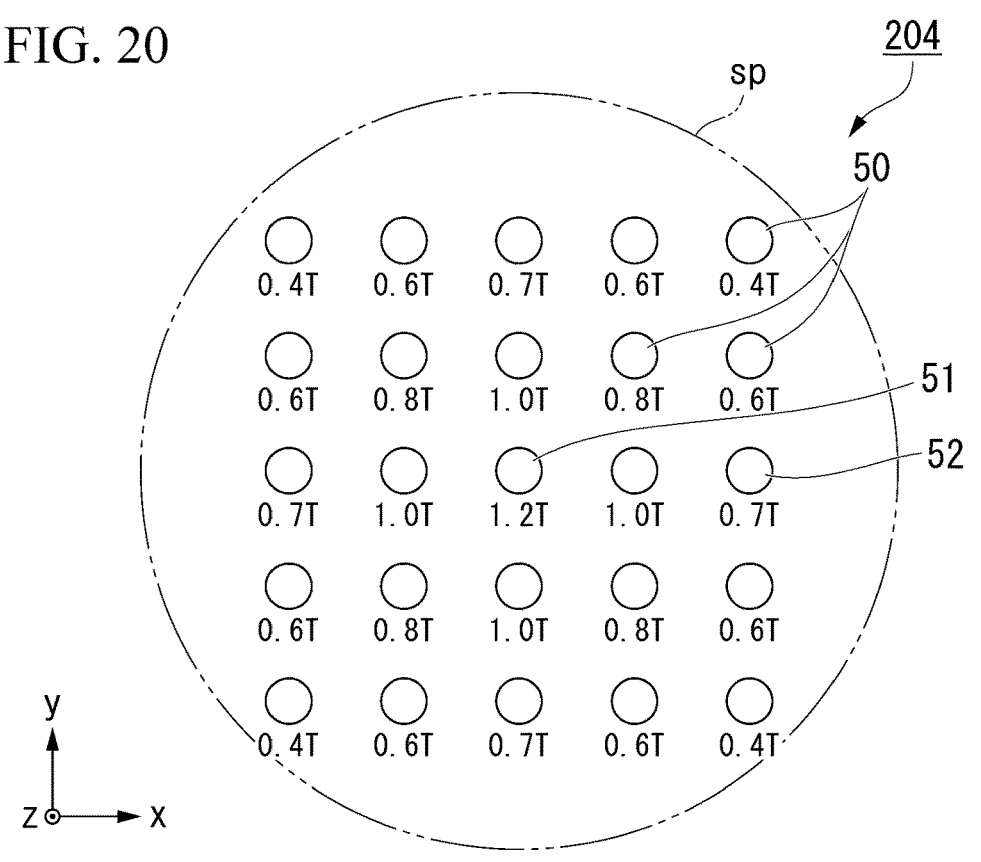
FIG. 20 is a plan view of a light detection element according to a fifth embodiment.

FIG. 20 is a plan view in which a light detection element 204 according to a fifth embodiment is viewed from the z direction. In the fifth embodiment, the same configurations as those of the first embodiment are designated by the same reference numerals, and the description thereof will be omitted.

The light detection element 204 includes a plurality of magnetic elements 50. The magnetic elements 50 are arranged to be inside the spot sp of the applied light L.

Each of the magnetic elements 50 has a layer structure similar to that of the magnetic element 10. In the example shown in FIG. 20, the saturation magnetization of the first ferromagnetic layer 1 of the magnetic element 50 becomes larger toward the magnetic element 30 close to the center of the spot sp and becomes smaller toward the magnetic element 30 away from the center. That is, in a plan view from the z direction, the saturation magnetization of the first ferromagnetic layer 1 becomes larger toward the magnetic element 50 having a short distance between its center and the center of the spot sp and the saturation magnetization of the first ferromagnetic layer 1 becomes smaller toward the magnetic element 50 having a long distance between its center and the center of the spot sp. In FIG. 20, an example of the saturation magnetization of each magnetic element 50 is written under each magnetic element 50.

For example, the magnetic elements 50 include a first magnetic element 51 and a second magnetic element 52. The first magnetic element 51 and the second magnetic element 52 are arranged to be inside the spot sp of the applied light L. For example, the first magnetic element 51 and the second magnetic element 52 are electrically connected in series or in parallel. In the magnetic elements 50, there may be elements in which the saturation magnetization of the first ferromagnetic layer 1 is different between the first magnetic element 51 and the second magnetic element 52. The first magnetic element 51 is on the side of the center of the spot sp in relation to the second magnetic element 52. That is, the distance between the center of the first magnetic element 51 and the center of the spot sp is shorter than the distance between the center of the second magnetic element 52 and the center of the spot sp in a plan view from the z direction. The saturation magnetization of the first ferromagnetic layer 1 of the first magnetic element 51 is larger than the saturation magnetization of the first ferromagnetic layer 1 of the second magnetic element 52. Since the saturation magnetization of the first ferromagnetic layer 1 is different between the first magnetic element 51 and the second magnetic element 52, the sensitivity to the light L is different.

The light intensity at the irradiation surface of each magnetic element 50 becomes larger toward the center of the spot sp. The output of the first magnetic element 51 having a relatively large saturation magnetization of the first ferromagnetic layer 1 is less likely to be saturated than that of the second magnetic element 52 even when irradiated with light having a high intensity. Further, since the second magnetic element 52 having a relatively small saturation magnetization of the first ferromagnetic layer 1 has a higher sensitivity to the light L than that of the first magnetic element 51, it is possible to obtain an output of a certain magnitude from the second magnetic element 52 even when the intensity of the applied light is smaller than that of the first magnetic element 51. In this way, since it is possible to effectively use both the output from the first magnetic element 51 and the output from the second magnetic element 52 in detecting the intensity of light in the light detection element 204 according to the fifth embodiment, the light detection element 204 according to the fifth embodiment has a large SN ratio.

Here, the light detection element 204 according to the fifth embodiment and the light detection element 202 according to the third embodiment are common in that the first magnetic elements 31 and 51 each having an output unlikely to be saturated are inside the spot sp and the second magnetic elements 32 and 52 each having a high sensitivity to the applied light are outside the spot sp. Thus, the sensitivity of a certain element in the magnetic elements to the applied light may be different from that of the other element by combining the characteristic configuration of the light detection element 202 and the characteristic configuration of the light detection element 204. Specifically, in at least two magnetic elements arranged to be inside the spot sp, the product of the saturation magnetization and the volume of the first ferromagnetic layer 1 may be increased toward the magnetic element close to the center of the spot sp.

Sixth Embodiment

Figure 21:
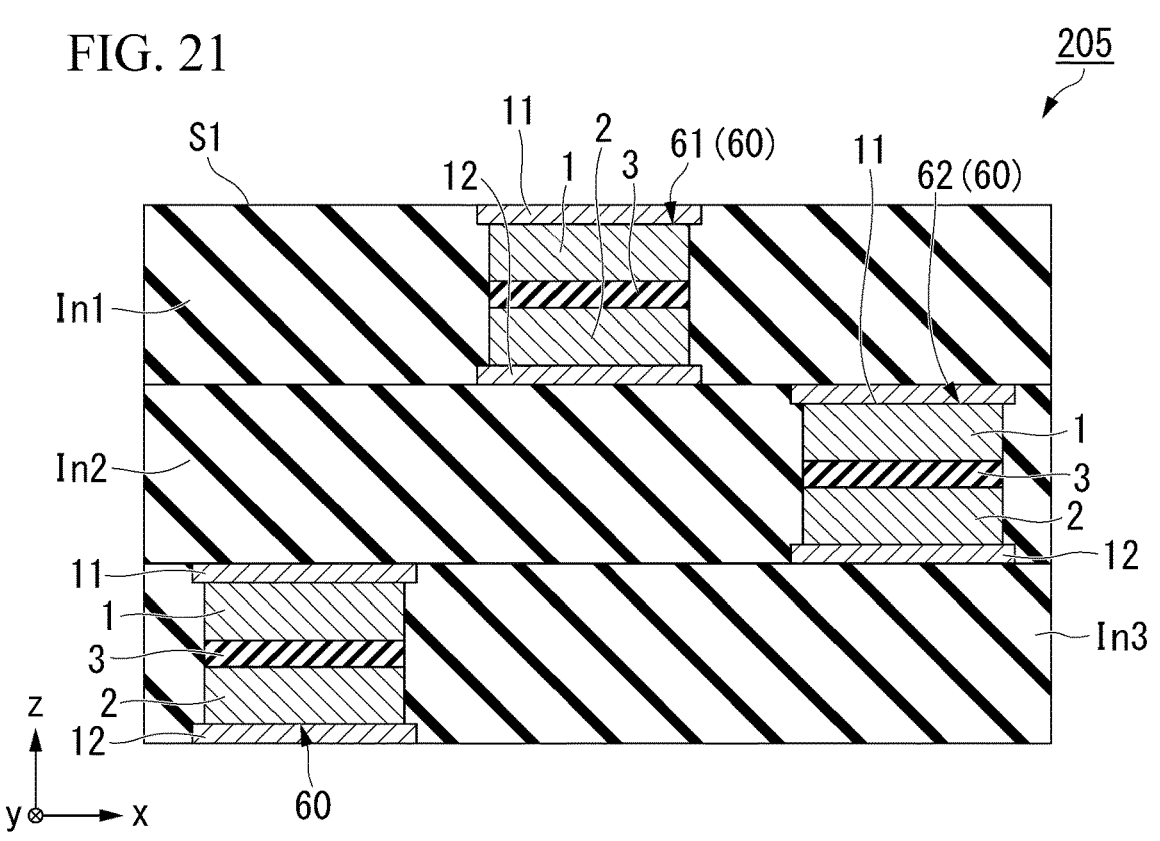
FIG. 21 is a cross-sectional view of a part of a light detection element according to a sixth embodiment.

FIG. 21 is a cross-sectional view of a part of a light detection element 205 according to a sixth embodiment. In the sixth embodiment, the same configurations as those of the first embodiment are designated by the same reference numerals, and the description thereof will be omitted. In FIG. 21, the first electrode 11 and the second electrode 12 connected to each magnetic element 60 and insulating layers In1, In2, and In3 covering the periphery of the magnetic element 60 are simultaneously shown.

The light detection element 205 includes a plurality of magnetic elements 60. The magnetic elements 60 are arranged to be inside the spot sp of the applied light L.

Each of the magnetic elements 60 has a layer structure similar to that of the magnetic element 10. For example, the magnetic elements 60 includes a first magnetic element 61 and a second magnetic element 62. The first magnetic element 61 and the second magnetic element 62 are arranged to be inside the spot sp of the applied light L. For example, the first magnetic element 61 and the second magnetic element 62 are electrically connected in series or in parallel.

The first magnetic element 61 is in a layer different from the second magnetic element 62. The first electrode 11 is located between the first magnetic element 61 and the light irradiation surface S1 and the insulating layer In1 and the first electrode 11 are located between the second magnetic element 62 and the light irradiation surface S1. The light irradiation surface S1 is a surface irradiated with the light of the light detection element including the magnetic element, the electrode, and the insulating layer. The light irradiation surface S1 is different from the irradiation surface of each magnetic element 60. In the magnetic elements 60, there may be elements having a layer different from that of the first magnetic element 61 and the second magnetic element 62.

At least two of the magnetic elements 60 do not overlap the other magnetic element 60 when viewed from the lamination direction. For example, the first magnetic element 61 and the second magnetic element 62 do not overlap the other magnetic element 60 when viewed from the lamination direction. When the configuration is satisfied, the light L is applied to the first magnetic element 61 and the second magnetic element 62 without the interference of the other magnetic element 60. It may be configured in such a way that each of the magnetic elements 60 does not overlap the other magnetic element 60 when viewed from the lamination direction.

Since the magnetic elements 60 are inside the same spot sp in the light detection element 205 according to the sixth embodiment, the SN ratio is large similarly to the light detection element 200 according to the first embodiment.

Seventh Embodiment

Figure 22:
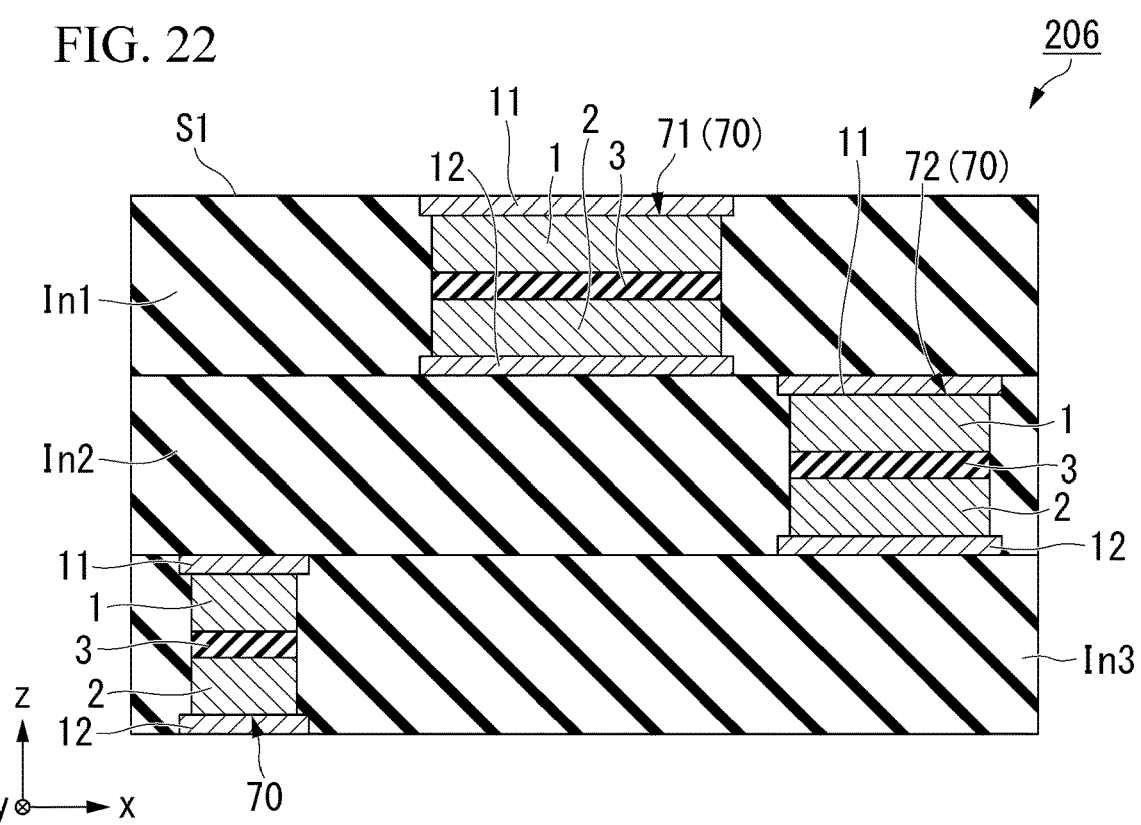
FIG. 22 is a cross-sectional view of a part of a light detection element according to a seventh embodiment.

FIG. 22 is a cross-sectional view of a part of a light detection element 206 according to a seventh embodiment. In an example shown in FIG. 22, the distance between the center of each of three magnetic elements 70 and the center of the spot sp in a plan view from the z direction is the same. In the seventh embodiment, the same configurations as those of the first embodiment are designated by the same reference numerals, and the description thereof will be omitted. In FIG. 22, the first electrode 11 and the second electrode 12 connected to each magnetic element 70 and the insulating layers In1, In2, and In3 covering the periphery of the magnetic element 70 are simultaneously shown.

The light detection element 206 includes a plurality of magnetic elements 70. The magnetic elements 70 are arranged to be inside the spot sp of the applied light L.

Each of the magnetic elements 70 has a layer structure similar to that of the magnetic element 10. For example, the magnetic elements 70 include a first magnetic element 71 and a second magnetic element 72. The first magnetic element 71 and the second magnetic element 72 are arranged to be inside the spot sp of the applied light L. For example, the first magnetic element 71 and the second magnetic element 72 are electrically connected in series or in parallel. The first magnetic element 71 is an example of the third magnetic element of claims. The second magnetic element 72 is an example of the fourth magnetic element of claims.

The first magnetic element 71 is in a layer different from the second magnetic element 72. The first electrode 11 is located between the first magnetic element 71 and the light irradiation surface S1 and the insulating layer In1 and the first electrode 11 are located between the second magnetic element 72 and the light irradiation surface S1. The first electrode 11 between the first magnetic element 71 and the light irradiation surface S1 is an example of the first intermediate layer of claims. The insulating layer In1 and the first electrode 11 between the second magnetic element 72 and the light irradiation surface S1 are examples of the second intermediate layer of claims. In the magnetic elements 70, there may be elements having a layer different from that of the first magnetic element 71 and the second magnetic element 72.

The first magnetic element 71 is closer to the light irradiation surface S1 of the light L than the second magnetic element 72. The total thickness of the insulating layer In1 and the first electrode 11 (the thickness of the second intermediate layer) between the second magnetic element 72 and the light irradiation surface S1 is thicker than the thickness of the first electrode 11 (the thickness of the first intermediate layer) between the first magnetic element 71 and the light irradiation surface S1. The transmittance of the light L between the light irradiation surface S1 and the first magnetic element 71 is higher than the transmittance of the light L between the light irradiation surface S1 and the second magnetic element 72.

The volume of the first ferromagnetic layer 1 is different between the first magnetic element 71 and the second magnetic element 72. The volume of the first ferromagnetic layer 1 of the first magnetic element 71 is larger than that of the second magnetic element 72. Since the volume of the first ferromagnetic layer 1 is different between the first magnetic element 71 and the second magnetic element 72, the sensitivity to the light L is different.

In the example shown in FIG. 22, since the area of the first ferromagnetic layer 1 when viewed from the z direction is different, the volume of the first ferromagnetic layer 1 is different between the first magnetic element 71 and the second magnetic element 72. In the example shown in FIG. 22, the thickness of the first ferromagnetic layer 1 is the same between the first magnetic element 71 and the second magnetic element 72. The volume of the first ferromagnetic layer 1 is not limited to the area when viewed from the z direction and may be different by allowing the thickness of the first ferromagnetic layer 1 to be different. Further, in the magnetic elements 70, there may be elements in which the volume of the first ferromagnetic layer 1 is different between the first magnetic element 71 and the second magnetic element 72. For example, the volume of the first ferromagnetic layer 1 of each of the magnetic elements 70 may become smaller toward the magnetic element 70 away from the light irradiation surface S1 of the light L.

The intensity of the light applied to each magnetic element 70 becomes smaller as the distance from the light irradiation surface S1 increases. The output of the first magnetic element 71 having a relatively large volume of the first ferromagnetic layer 1 is less likely to be saturated than that of the second magnetic element 72 even when it is irradiated with light having a high intensity (see FIGS. 15 and 16). Further, since the sensitivity to the light L of the second magnetic element 72 having a relatively small volume of the first ferromagnetic layer 1 is higher than that of the first magnetic element 71 (see FIGS. 15 and 16), it is possible to obtain an output of a certain magnitude from the second magnetic element 72 even when the intensity of the applied light is smaller than that of the first magnetic element 71. In this way, since it is possible to effectively use both the output from the first magnetic element 71 and the output from the second magnetic element 72 in detecting the intensity of light in the light detection element 206 according to the seventh embodiment, the light detection element 206 according to the seventh embodiment has a large SN ratio.

Eighth Embodiment

Figure 23:
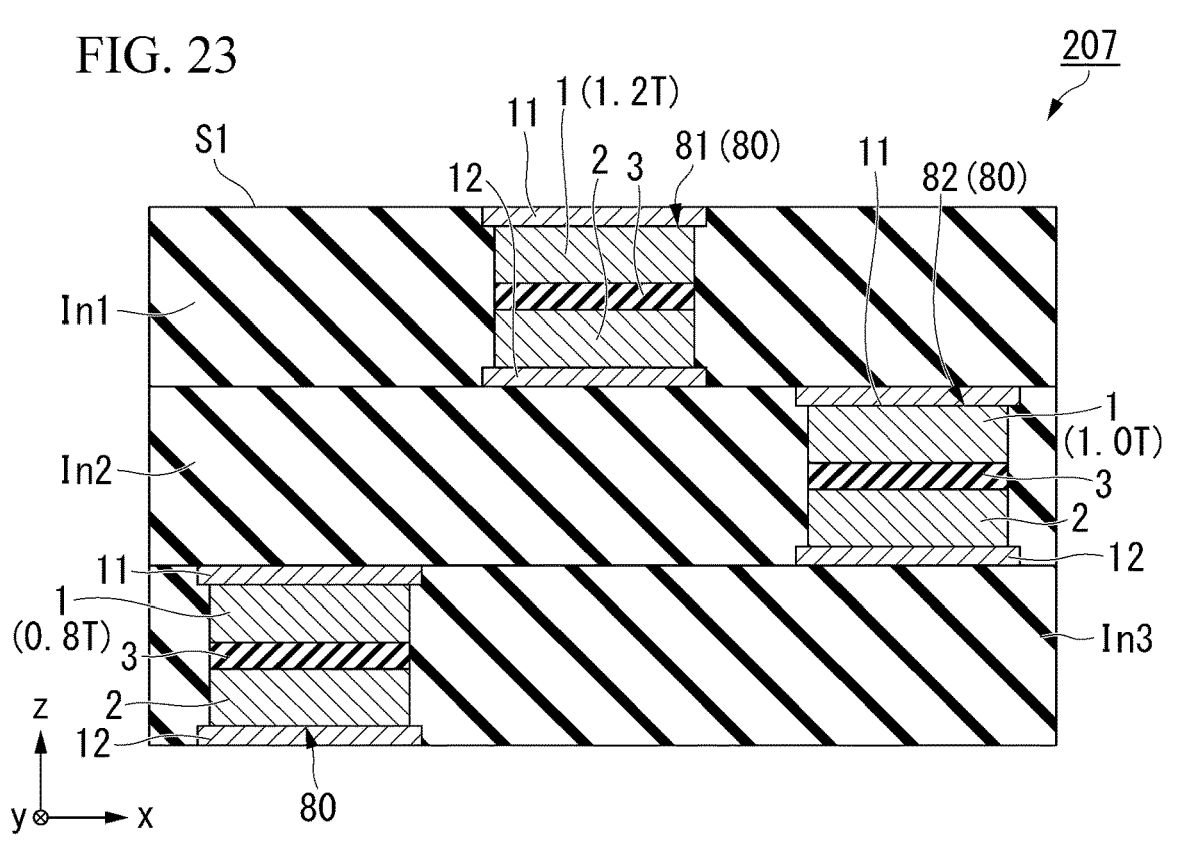
FIG. 23 is a cross-sectional view of a part of a light detection element according to an eighth embodiment.

FIG. 23 is a cross-sectional view of a part of a light detection element 207 according to an eighth embodiment. In an example shown in FIG. 23, the distance between the center of each of three magnetic elements 80 and the center of the spot sp in a plan view from the z direction is the same. In the eighth embodiment, the same configurations as those of the first embodiment are designated by the same reference numerals, and the description thereof will be omitted. In FIG. 23, the first electrode 11 and the second electrode 12 connected to each magnetic element 80 and the insulating layers In1, In2, and In3 covering the periphery of the magnetic element 80 are simultaneously shown.

The light detection element 207 includes a plurality of magnetic elements 80. The magnetic elements 80 are arranged to be inside the spot sp of the applied light L.

Each of the magnetic elements 80 has a layer structure similar to that of the magnetic element 10. For example, the magnetic elements 80 include a first magnetic element 81 and a second magnetic element 82. The first magnetic element 81 and the second magnetic element 82 are arranged to be inside the spot sp of the applied light L. For example, the first magnetic element 81 and the second magnetic element 82 are electrically connected in series or in parallel. The first magnetic element 81 is an example of the third magnetic element of claims. The second magnetic element 82 is an example of the fourth magnetic element of claims.

The first magnetic element 81 is in a layer different from the second magnetic element 82. The first electrode 11 is located between the first magnetic element 81 and the light irradiation surface S1 and the insulating layer In1 and the first electrode 11 are located between the second magnetic element 82 and the light irradiation surface S1. The first electrode 11 between the first magnetic element 81 and the light irradiation surface S1 is an example of the first intermediate layer of claims. The insulating layer In1 and the first electrode 11 between the second magnetic element 82 and the light irradiation surface S1 are examples of the second intermediate layer of claims. In the magnetic elements 80, there may be elements having different layers from those of the first magnetic element 81 and the second magnetic element 82.

The first magnetic element 81 is closer to the light irradiation surface S1 of the light L than the second magnetic element 82. The total thickness of the insulating layer In1 and the first electrode 11 (the thickness of the second intermediate layer) between the second magnetic element 82 and the light irradiation surface S1 is thicker than the thickness of the first electrode 11 (the thickness of the first intermediate layer) between the first magnetic element 81 and the light irradiation surface S1. The transmittance of the light L between the light irradiation surface S1 and the first magnetic element 81 is higher than the transmittance of the light L between the light irradiation surface S1 and the second magnetic element 82.

The saturation magnetization of the first ferromagnetic layer 1 is different between the first magnetic element 81 and the second magnetic element 82. FIG. 23 shows an example of the saturation magnetization of each magnetic element 80. In the example shown in FIG. 23, the saturation magnetization of the first ferromagnetic layer 1 of the magnetic element 80 becomes smaller toward the magnetic element 80 away from the light irradiation surface S1 of the light L. The saturation magnetization of the first ferromagnetic layer 1 of the first magnetic element 81 is larger than the saturation magnetization of the first ferromagnetic layer 1 of the second magnetic element 82.

The intensity of the light applied to each magnetic element 70 becomes smaller as the distance from the light irradiation surface S1 increases. The output of the first magnetic element 81 having a relatively large saturation magnetization of the first ferromagnetic layer 1 is less likely to be saturated than that of the second magnetic element 82 even when it is irradiated with light having a high intensity. Further, since the sensitivity to the light L of the second magnetic element 82 having a relatively small saturation magnetization of the first ferromagnetic layer 1 is higher than that of the first magnetic element 81, it is possible to obtain an output of a certain magnitude from the second magnetic element 82 even when the intensity of the applied light is smaller than that of the first magnetic element 81. In this way, since it is possible to effectively use both the output from the first magnetic element 81 and the output from the second magnetic element 82 in detecting the intensity of light in the light detection element 207 according to the eighth embodiment, the light detection element 207 according to the eighth embodiment has a large SN ratio.

Here, the light detection element 207 according to the eighth embodiment and the light detection element 206 according to the seventh embodiment are common in that the first magnetic elements 71 and 81 each having an output less likely to be saturated are relatively in the vicinity of the light irradiation surface S1 of the light L. Thus, the sensitivity of a certain element in the magnetic elements to the applied light may be different from that of the other magnetic element by combining the characteristic configuration of the light detection element 206 and the characteristic configuration of the light detection element 207. Specifically, in at least two magnetic elements arranged to be inside the spot sp, the product of the saturation magnetization and the volume of the first ferromagnetic layer 1 may be increased toward the magnetic element close to the light irradiation surface S1 of the light L.

Ninth Embodiment

Figure 24:
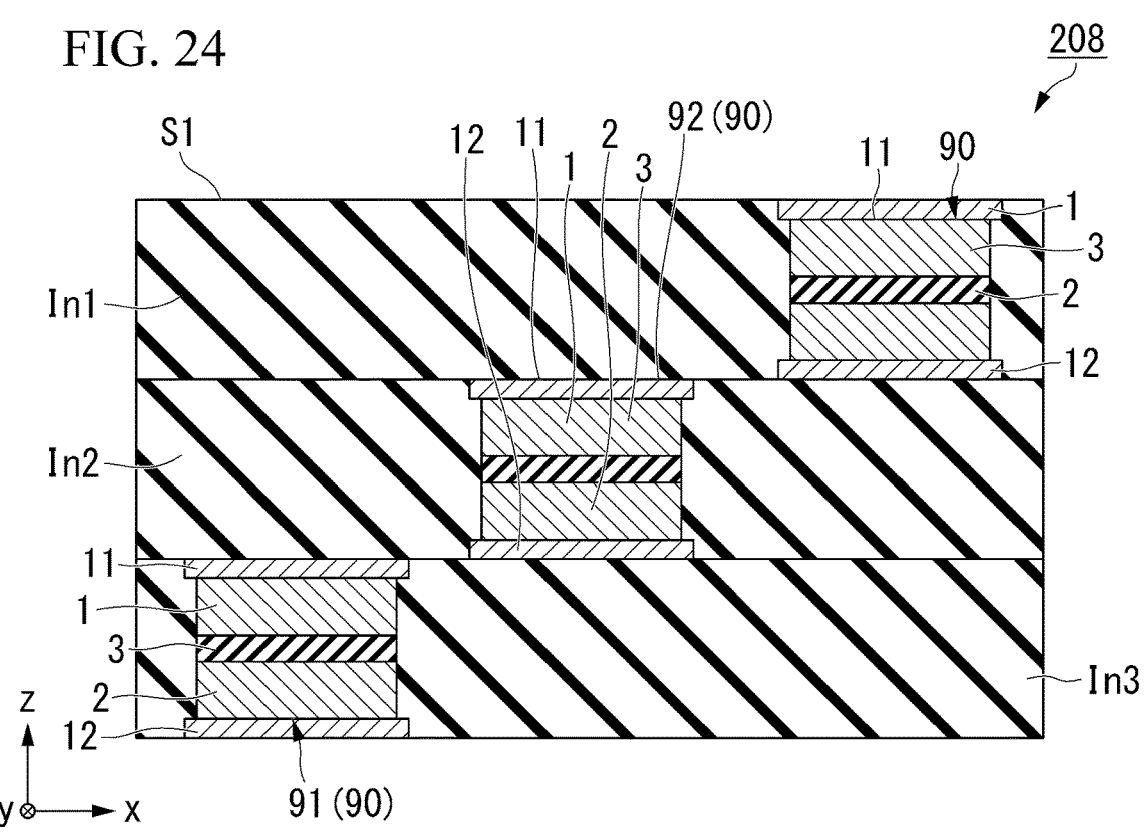
FIG. 24 is a cross-sectional view of a part of a light detection element according to a ninth embodiment.

FIG. 24 is a cross-sectional view of a part of a light detection element 208 according to a ninth embodiment. In the ninth embodiment, the same configurations as those of the first embodiment are designated by the same reference numerals, and the description thereof will be omitted. In FIG. 24, the first electrode 11 and the second electrode 12 connected to each magnetic element 90 and the insulating layers In1, In2, and In3 covering the periphery of the magnetic element 90 are simultaneously shown. Further, in FIG. 24, the left side (−x side) is closer to the center of the spot sp.

The light detection element 208 includes a plurality of magnetic elements 90. The magnetic elements 90 are arranged to be inside the spot sp of the applied light L.

Each of the magnetic elements 90 has a layer structure similar to that of the magnetic element 10. For example, the magnetic elements 90 include a first magnetic element 91 and a second magnetic element 92. The first magnetic element 91 and the second magnetic element 92 are arranged to be inside the spot sp of the applied light L. For example, the first magnetic element 91 and the second magnetic element 92 are electrically connected in series or in parallel. The first magnetic element 91 is an example of the fifth magnetic element of claims. The second magnetic element 92 is an example of the sixth magnetic element of claims.

The first magnetic element 91 is on the side of the center of the spot sp in relation to the second magnetic element 92. The first magnetic element 91 is in a layer different from the second magnetic element 92. The insulating layer In1, the insulating layer In2, and the first electrode 11 are located between the first magnetic element 91 and the light irradiation surface S1 and the insulating layer In1 and the first electrode 11 are located between the second magnetic element 92 and the light irradiation surface S1. The insulating layer In1, the insulating layer In2, and the first electrode 11 between the first magnetic element 91 and the light irradiation surface S1 are examples of the third intermediate layer of claims. The insulating layer In1 and the first electrode 11 between the second magnetic element 92 and the light irradiation surface S1 are examples of the fourth intermediate layer of claims. In the magnetic elements 90, there may be elements having different layers from those of the first magnetic element 91 and the second magnetic element 92.

The second magnetic element 92 is closer to the light irradiation surface S1 of the light L than the first magnetic element 91. The total thickness of the insulating layer In1, the insulating layer In2, and the first electrode 11 (the thickness of the third intermediate layer) between the first magnetic element 91 and the light irradiation surface S1 is thicker than the total thickness of the insulating layer In1 and the first electrode 11 (the thickness of the fourth intermediate layer) between the second magnetic element 92 and the light irradiation surface S1. The transmittance of the light L of the fourth intermediate layer is higher than that of the third intermediate layer. In the example shown in FIG. 24, the magnetic element 90 is closer to the light irradiation surface S1 of the light L toward the magnetic element 90 away from the center of the spot sp. Further, in the example shown in FIG. 24, the volume of the first ferromagnetic layer 1 and the saturation magnetization of the first ferromagnetic layer 1 are the same between the first magnetic element 91 and the second magnetic element 92.

The light intensity of the light irradiation surface S1 becomes larger toward the center of the spot sp. In the light detection element 208 according to the ninth embodiment, the second magnetic element 92 relatively away from the center of the spot sp has higher transmittance of the light L between the second magnetic element and the light irradiation surface S1 of the light L than the first magnetic element 91. When the configuration is satisfied, it is possible to apply the magnetic element 90 disposed on the outer peripheral side of the spot sp having a weak light intensity with light L having a sufficient intensity. Thus, it is possible to reduce a variation in intensity of light applied to the first magnetic element 91 and the second magnetic element 92. Accordingly, it is possible to obtain a certain amount of output without saturating the output in both the first magnetic element 91 and the second magnetic element 92. That is, since it is possible to effectively use both the output from the first magnetic element 91 and the output from the second magnetic element 92 in detecting the intensity of light in the light detection element 208 according to the ninth embodiment, the light detection element 208 according to the ninth embodiment has a large SN ratio.

An example of the ninth embodiment has been described above, but the ninth embodiment is not limited to this example.

First Modified Example

Figure 25:
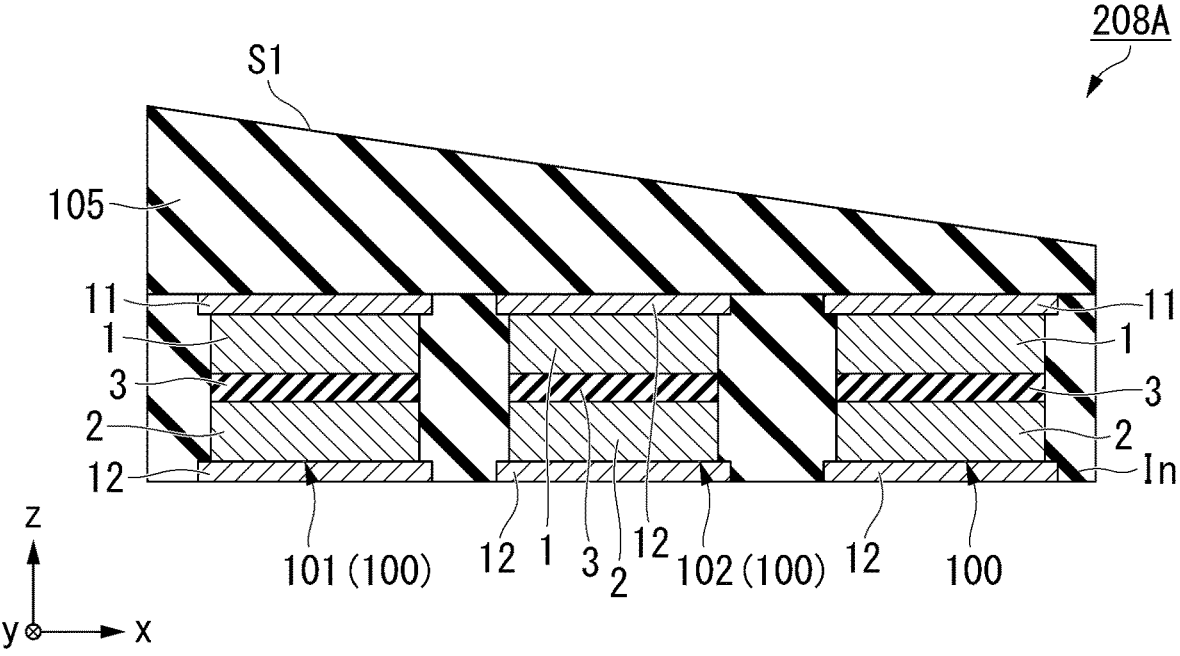
FIG. 25 is a cross-sectional view of a part of a light detection element according to a first modified example of the ninth embodiment.

For example, FIG. 25 is a cross-sectional view of a part of a light detection element 208A according to a first modified example of the ninth embodiment. In FIG. 25, the left side (−x side) is closer to the center of the spot sp.

The light detection element 208A includes a plurality of magnetic elements 100 and a protective film 105. The magnetic elements 100 are arranged to be inside the spot sp of the applied light L. Each of the magnetic elements 100 has a layer structure similar to that of the magnetic element 10. For example, the magnetic elements 100 include a first magnetic element 101 and a second magnetic element 102. The first magnetic element 101 and the second magnetic element 102 are arranged to be inside the spot sp of the applied light L. For example, the first magnetic element 101 and the second magnetic element 102 are electrically connected in series or in parallel. The first magnetic element 101 is an example of the fifth magnetic element of claims. The second magnetic element 102 is an example of the sixth magnetic element of claims. The first magnetic element 101 is on the side of the center of the spot sp in relation to the second magnetic element 102.

In the example shown in FIG. 25, the thickness of the protective film 105 becomes thicker toward the center of the spot sp. In the protective film 105, for example, the light irradiation surface S1 is inclined with respect to the xy plane. The light irradiation surface S1 of the protective film 105 may have a step shape. The protective layer 105 and the first electrode 11 between the first magnetic element 101 and the light irradiation surface S1 are examples of the third intermediate layer of claims. The protective layer 105 and the first electrode 11 between the second magnetic element 102 and the light irradiation surface S1 are examples of the fourth intermediate layer of claims. The transmittance of the light L of the fourth intermediate layer is higher than that of the third intermediate layer.

In the light detection element 208A, the second magnetic element 102 relatively away from the center of the spot sp has higher transmittance of the light L between the second magnetic element and the light irradiation surface S1 of the light L than the first magnetic element 101. Thus, it is possible to reduce a variation in intensity of light applied to the first magnetic element 101 and the second magnetic element 102.

Second Modified Example

Figure 26:
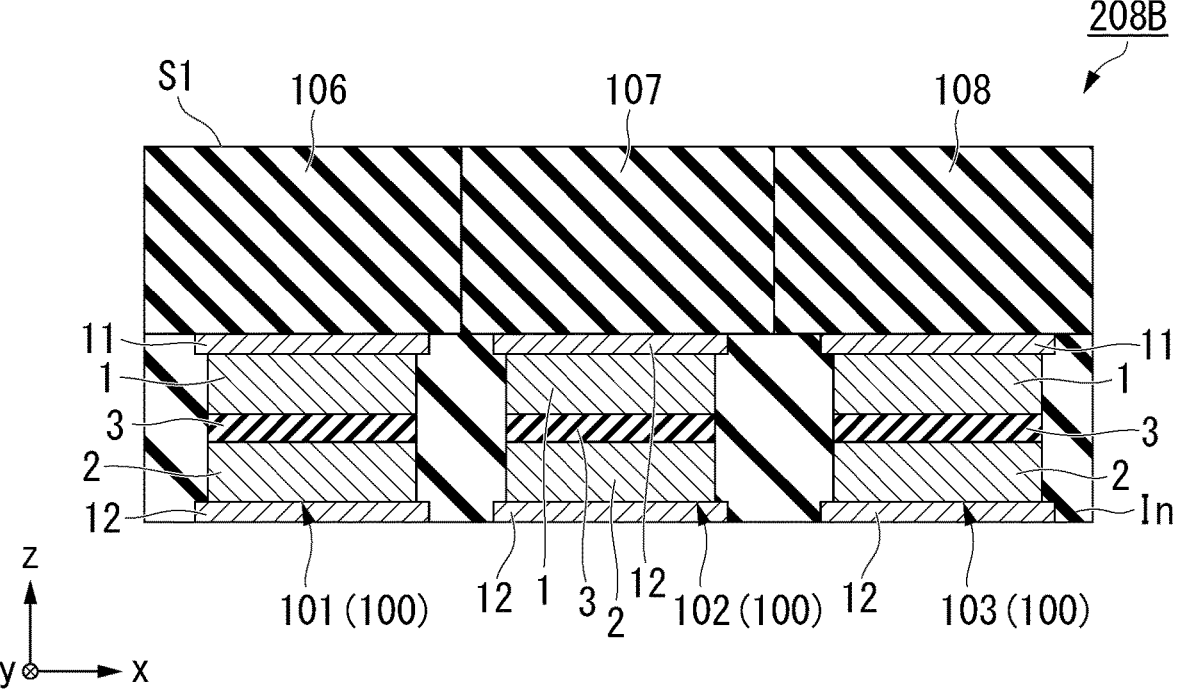
FIG. 26 is a cross-sectional view of a part of a light detection element according to a second modified example of the ninth embodiment.

For example, FIG. 26 is a cross-sectional view of a part of a light detection element 208B according to a second modified example of the ninth embodiment. In FIG. 26, the left side (–x side) is closer to the center of the spot sp. In FIG. 26, the same configurations as those in FIG. 25 are designated by the same reference numerals.

The light detection element 208B includes dielectric films 106, 107, and 108. The material of the dielectric films 106, 107, and 108 is, for example, an oxide, a nitride, or an oxynitride containing one or more metal elements or metalloid elements. More specifically, the material of the dielectric films 106, 107, and 108 is an oxide, a nitride, or an oxynitride containing one or more elements selected from a group consisting of, for example, Al, Si, Ta, In, Hf, Sn, Zn, Ti, Cu, Ce, Zr, Nb, Mg, B, Pb, Ca, La, and Ge. The dielectric film 106 is located on the first magnetic element 101. The dielectric film 107 is located on the second magnetic element 102. The dielectric film 108 is located on the third magnetic element 103. The transmittance of the light L of the dielectric film 106 is lower than that of the dielectric film 107. The transmittance of the light L of the dielectric film 107 is lower than that of the dielectric film 108. The transmittance of the light L of the dielectric film can be different depending on, for example, the material of the dielectric. Further, the transmittance of the light L of the dielectric film can be different depending on the different amount of the additive added to the dielectric. As an example, a combination in which the material of the dielectric film 106 is hafnium oxide ($HfO_2$), the material of the dielectric film 107 is aluminum oxide ($Al_2O_3$), and the material of the dielectric film 108 is silicon oxide ($SiO_2$) can be mentioned. In this case, for example, the transmittance for light having a wavelength of 500 nm becomes lower in the order of hafnium oxide ($HfO_2$), aluminum oxide ($Al_2O_3$), and silicon oxide ($SiO_2$). Therefore, when the wavelength of the light L is 500 nm, the transmittance of the light L of the dielectric film 106 becomes lower than that of the dielectric film 107 and the transmittance of the light L of the dielectric film 107 becomes lower than that of the dielectric film 108.

In the light detection element 208B, the second magnetic element 102 relatively away from the center of the spot sp has higher transmittance of the light L between the second magnetic element and the light irradiation surface S1 of the light L than the first magnetic element 101. Thus, it is possible to reduce a variation in intensity of light applied to the first magnetic element 101 and the second magnetic element 102.

Third Modified Example

Figure 27:
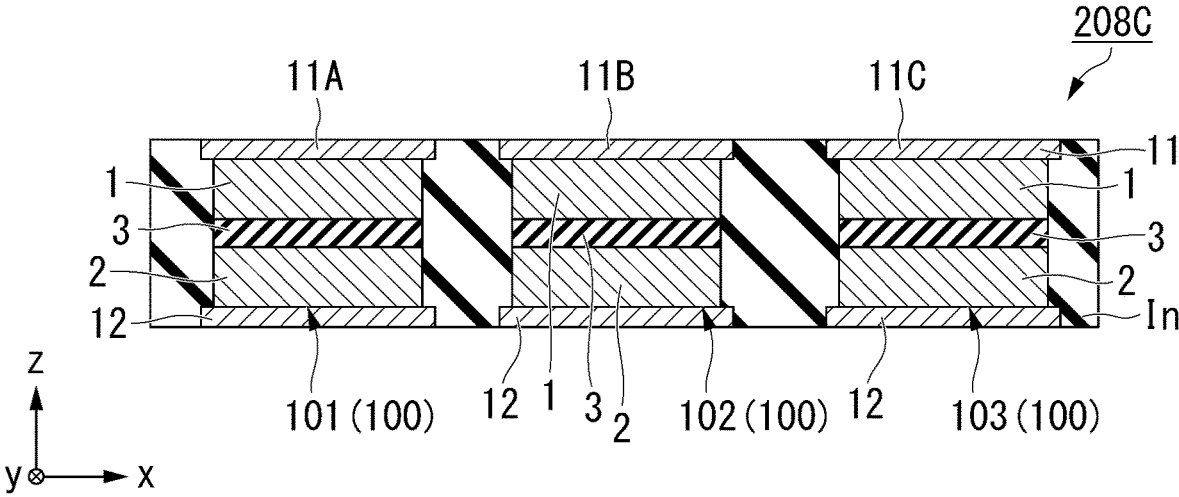
FIG. 27 is a cross-sectional view of a part of a light detection element according to a third modified example of the ninth embodiment.

For example, FIG. 27 is a cross-sectional view of a part of a light detection element 208C according to a third modified example of the ninth embodiment. In FIG. 27, the left side (–x side) is closer to the center of the spot sp. In FIG. 27, the same configurations as those in FIG. 25 are designated by the same reference numerals.

In the light detection element 208C, each of the first electrodes 11A, 11B, and 11C has a different transmittance of the light L. The transmittance of the light L of the first electrode 11A is lower than that of the first electrode 11B. The transmittance of the light L of the first electrode 11B is lower than that of the first electrode 11C. The transmittance of the first electrode can be different depending on, for example, the different composition of the first electrode. For example, when indium tin oxide (ITO) is used as the material of the first electrode, the transmittance of light can be increased by increasing the composition ratio of tin to indium.

In the light detection element 208C, the second magnetic element 102 relatively away from the center of the spot sp has higher transmittance of the light L between the second magnetic element and the light irradiation surface S1 of the light L than the first magnetic element 101. Thus, it is possible to reduce a variation in intensity of light applied to the first magnetic element 101 and the second magnetic element 102.

As described above, the present disclosure is not limited to the above-described embodiments and modified examples, and various modifications and changes can be made within the scope of the gist of the present disclosure described within the scope of claims. For example, the characteristic configurations of the above-described embodiments and modified examples can be combined.

The light detection elements according to the above-described embodiments and modified examples can be applied to the light sensor device of the image sensor or the like, the transceiver device of the communication system, or the like.

Figure 28:
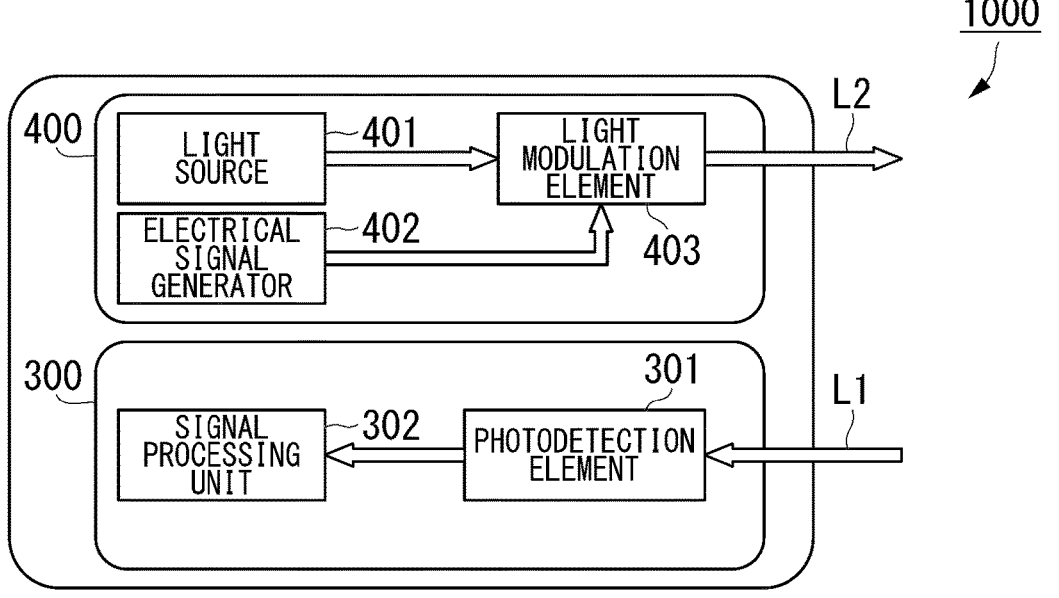
FIG. 28 is a block diagram of a transceiver device according to a first application example.

FIG. 28 is a block diagram of a transceiver device 1000 according a first application example. The transceiver device 1000 includes a receiving device 300 and a transmitting device 400. The receiving device 300 receives an optical signal L1 and the transmitting device 400 transmits an optical signal L2.

The receiving device 300 includes, for example, a light detection element 301 and a signal processing unit 302. The light detection element 301 is one of the light detection elements of the embodiments or modified examples. In the receiving device 300, the first ferromagnetic layers 1 of the magnetic elements are irradiated with the light which includes the high-frequency optical signal L1 and of which the intensity changes. The light detection element 301 converts the optical signal L1 into an electric signal. The operation of the light detection element 301 may be any one of the first operation example and the second operation example. The signal processing unit 302 processes the electric signal converted by the light detection element 301. The signal processing unit 302 receives the signal included in the optical signal L1 by processing the electric signal generated from the light detection element 301. The receiving device 300 receives a signal included in the optical signal L1 on the basis of, for example, the combined output voltage of the magnetic elements.

The transmitting device 400 includes, for example, a light source 401, an electric signal generator 402, and a light modulation element 403. The light source 401 is, for example, a laser element. The light source 401 may be outside the transmitting device 400. The electric signal generator 402 generates an electric signal on the basis of transmitted information. The electric signal generator 402 may be integrated with a signal converting element of the signal processing unit 302. The light modulation element 403 modulates the light output from the light source 401 on the basis of the electric signal generated by the electric signal generator 402 and outputs an optical signal L2.

Figure 29:
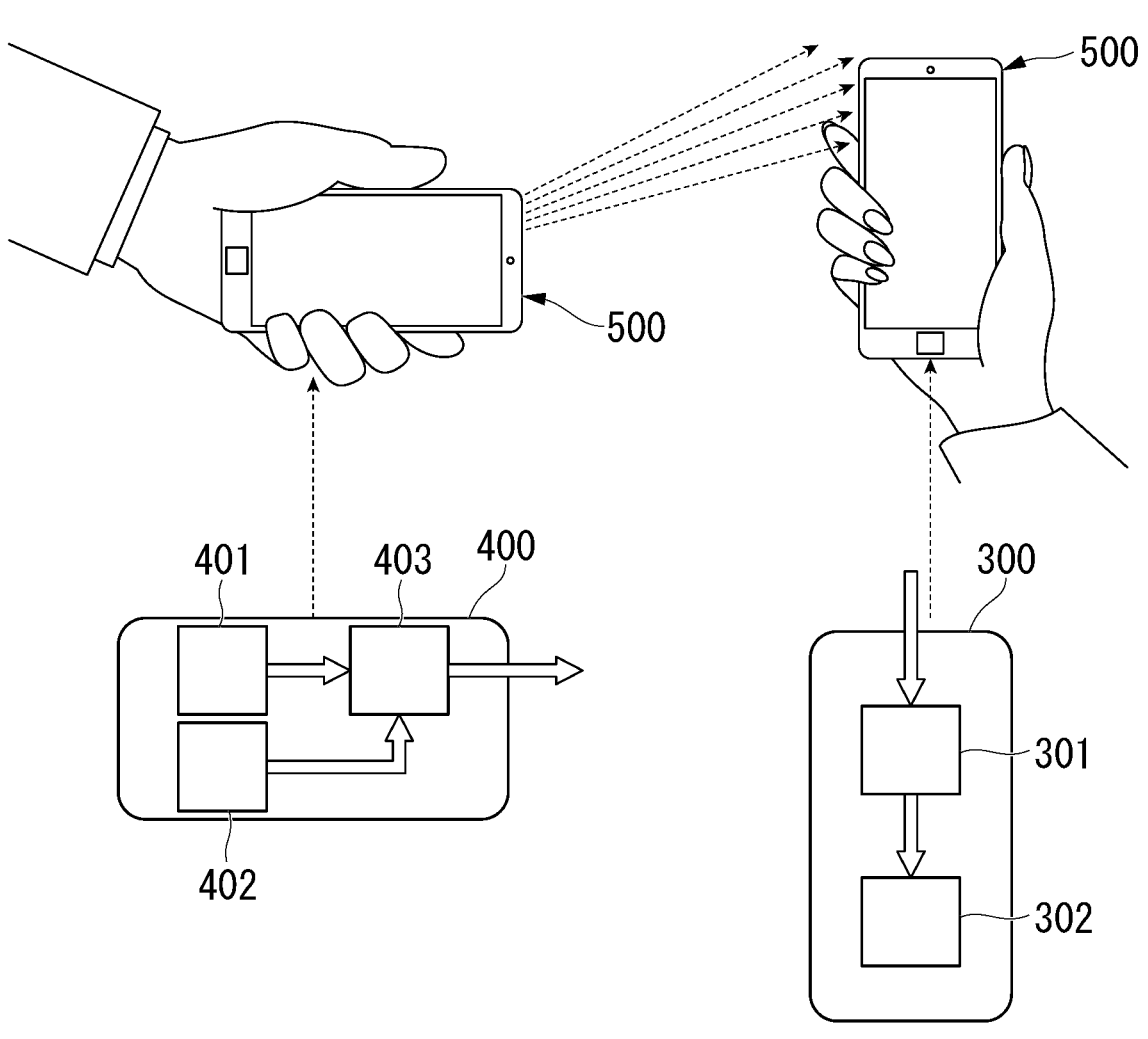
FIG. 29 is a conceptual diagram of an example of a communication system.

FIG. 29 is a conceptual diagram of an example of the communication system. The communication system shown in FIG. 29 includes two terminal devices 500. The terminal device 500 is, for example, a smartphone, a tablet, a personal computer, or the like.

Each of the terminal devices 500 includes a receiving device 300 and a transmitting device 400. The optical signal transmitted from the transmitting device 400 of one terminal device 500 is received by the receiving device 300 of the other terminal device 500. The light used for the transmission and reception between the terminal devices 500 is, for example, visible light. The receiving device 300 includes the above-described light detection element as the light detection element 301. Since the above-described light detection element has an excellent SN ratio, the communication system shown in FIG. 29 has high reliability.

Figure 30:
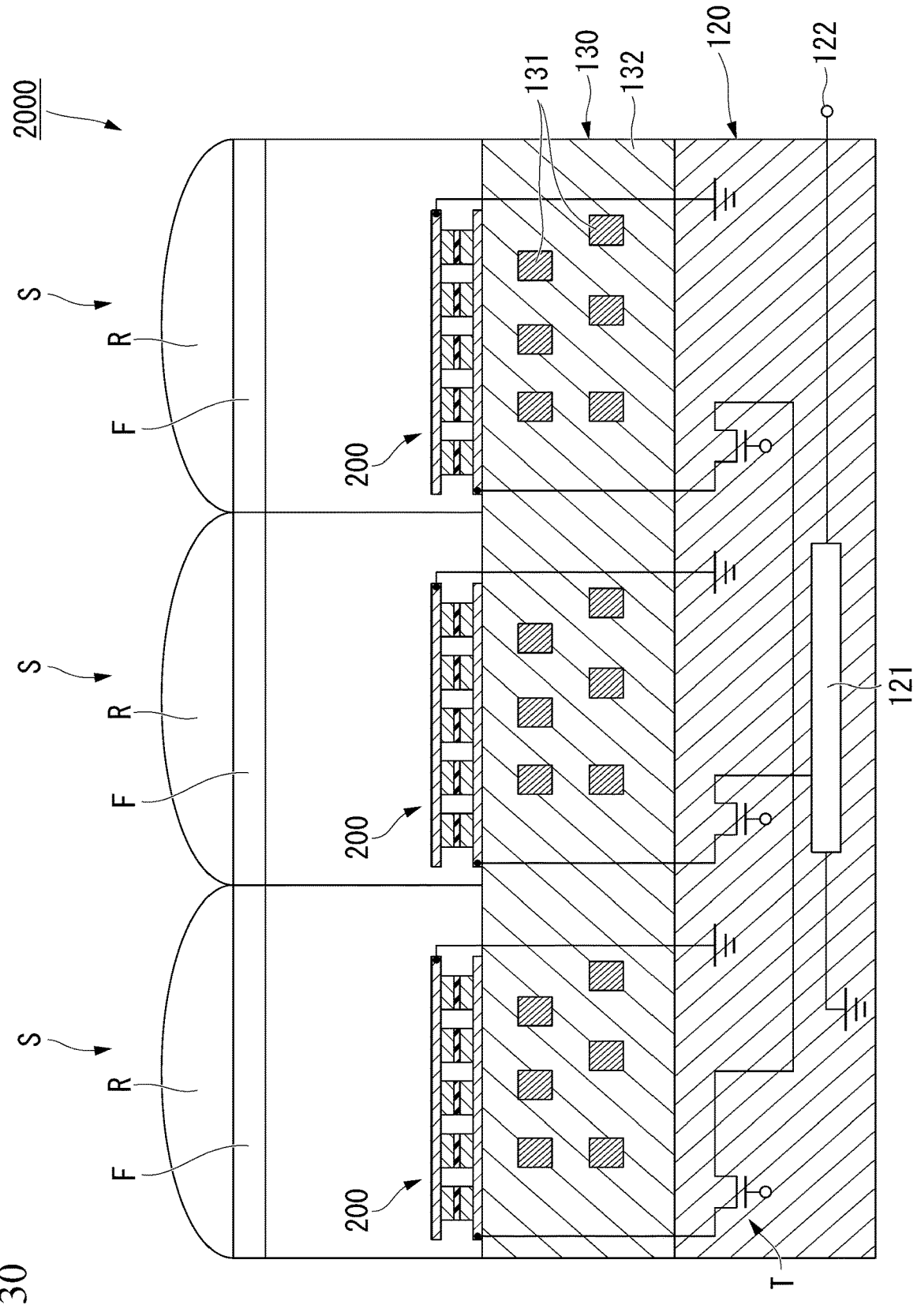
FIG. 30 is a conceptual diagram of a cross-section of a light sensor device according to a second application example.

FIG. 30 is a conceptual diagram of a cross-section of a light sensor device 2000 according to a second application example. The light sensor device 2000 includes, for example, a circuit board 120, a wiring layer 130, and a plurality of light sensors S. The wiring layer 130 and each of the light sensors S are formed on the circuit board 120.

Each of the light sensors S includes, for example, the light detection element 200, a wavelength filter F, and a lens R. FIG. 30 shows an example in which the light detection element 200 is used, but a light detection element according to another embodiment and modified example may be used. The light detection element 200 is irradiated with light having transmitted through the wavelength filter F. As described above, the light detection element 200 replaces the light applied to the magnetic elements 10 with an electric signal. The light detection element 200 may be operated in the second operation example.

The wavelength filter F selects light of a specific wavelength and transmits light in a specific wavelength range. The wavelength range of the light transmitted by each wavelength filter F may be the same or different. For example, the light sensor device 2000 may include a light sensor S (hereinafter, referred to as a blue sensor) having a wavelength filter F transmitting blue (wavelength range of 380 nm or more and less than 490 nm), a light sensor S (hereinafter, referred to as a green sensor) having a wavelength filter F transmitting green (wavelength range of 490 nm or more and less than 590 nm), and a light sensor S (hereinafter, referred to as a red sensor) having a wavelength filter F transmitting red (wavelength range of 590 nm or more and less than 800 nm). When the blue sensor, the green sensor, and the red sensor are set as one pixel and these pixels are arranged, the light sensor device 2000 can be used as an image sensor.

The lens R collects light toward the magnetic elements 10. The plurality of light detection elements 200 are arranged below one wavelength filter F.

The circuit board 120 includes, for example, an analog-digital converter 121 and an output terminal 122. The electric signal sent from the light sensor S is replaced with digital data by the analog-digital converter 121, and is output from the output terminal 122.

The wiring layer 130 includes a plurality of wires 131. An interlayer insulating film 132 is provided between the plurality of wires 131. The wire 131 electrically connects the respective circuit boards 120 of the light sensor S and the calculation circuits formed on the circuit board 120. The respective circuit boards 120 of the light sensor S are connected to each other via, for example, a through wire penetrating the interlayer insulating film 132 in the z direction. It is possible to reduce noise by shortening the distance between the wires between the respective circuit boards 120 of the light sensor S.

The wire 131 has conductivity. The wire 131 is, for example, Al, Cu, or the like. The interlayer insulating film 132 is an insulator that insulates between wirings of multilayer wiring and between elements. The interlayer insulating film 132 is, for example, an oxide, a nitride, or an oxynitride of S1, Al, and Mg. The interlayer insulating film 132 is, for example, silicon oxide ($SiO_x$), silicon nitride ($SiN_x$), silicon carbide (SiC), chromium nitride, silicon nitride (SiCN), silicon nitride (SiON), aluminum oxide ($Al_2O_3$), zirconium oxide ($ZrO_x$), or the like.

Figure 31:
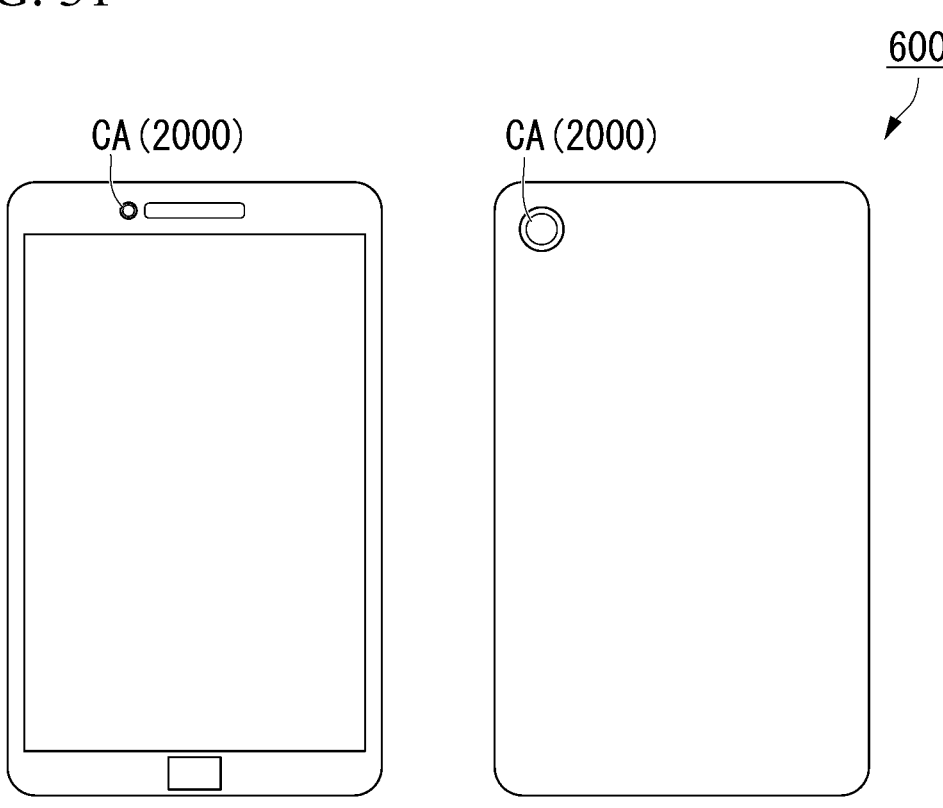
FIG. 31 is a schematic diagram of an example of a terminal device.

The above light sensor device 2000 can be used in, for example, a terminal device. FIG. 31 is a schematic diagram of an example of a terminal device 600. The left side of FIG. 31 is the front surface of the terminal device 600 and the right side of FIG. 31 is the rear surface of the terminal device 600. The terminal device 600 includes a camera CA. The above light sensor device 2000 can be used in an imaging element of the camera CA. In FIG. 31, a smartphone has been shown as an example of the terminal device 600, but the present disclosure is not limited to this case. The terminal device 600 is, for example, a tablet, a personal computer, a digital camera, or the like in addition to the smartphone.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A light detection element comprising:
a plurality of magnetic elements, and
an optical device,
wherein each of the magnetic elements includes a first
ferromagnetic layer that is irradiated with light and a second ferromagnetic layer and a spacer layer sandwiched between the first ferromagnetic layer and the second ferromagnetic layer, and wherein at least two of the magnetic elements are arranged to be inside a spot of the light from the optical device applied to the first ferromagnetic layers of the at least two of the magnetic elements.

2. The light detection element according to claim 1,
wherein the magnetic elements include a first magnetic element and a second magnetic element arranged to be inside the spot, and
wherein the first magnetic element and the second magnetic element have a different volume of the first ferromagnetic layer.

3. The light detection element according to claim 2,
wherein the first magnetic element is closer to a center of the spot than the second magnetic element, and
wherein the first magnetic element has a larger volume of the first ferromagnetic layer than that of the second magnetic element.

4. The light detection element according to claim 1,
wherein the magnetic elements include a first magnetic element and a second magnetic element arranged to be inside the spot, and
wherein the first magnetic element and the second magnetic element have different saturation magnetization of the first ferromagnetic layer.

5. The light detection element according to claim 4,
wherein the first magnetic element is closer to a center of the spot than the second magnetic element, and
wherein the first magnetic element has larger saturation magnetization of the first ferromagnetic layer than that of the second magnetic element.

6. The light detection element according to claim 1,
wherein the magnetic elements include a third magnetic element and a fourth magnetic element arranged to be inside the spot,
the light detection element further includes a first intermediate layer between the first ferromagnetic layer of the third magnetic element and a light irradiation surface that is a surface on a side irradiated with the light of the light detection element, and
the light detection element further includes a second intermediate layer between the first ferromagnetic layer of the fourth magnetic element and the light irradiation surface,
wherein the third magnetic element is closer to the light irradiation surface than the fourth magnetic element, and
wherein the third magnetic element has a larger volume of the first ferromagnetic layer than that of the fourth magnetic element.

7. The light detection element according to claim 1,
wherein the magnetic elements include a third magnetic element and a fourth magnetic element arranged to be inside the spot, the light detection element further includes a first intermediate layer between the first ferromagnetic layer of the third magnetic element and a light irradiation surface that is a surface on a side irradiated with the light of the light detection element, and
the light detection element further includes a second intermediate layer between the first ferromagnetic layer of the fourth magnetic element and the light irradiation surface,
wherein the third magnetic element is closer to the light irradiation surface than the fourth magnetic element, and
wherein the third magnetic element has larger saturation magnetization of the first ferromagnetic layer than that of the fourth magnetic element.

8. The light detection element according to claim 1,
wherein the magnetic elements include a fifth magnetic element and a sixth magnetic element arranged to be inside the spot,
wherein the fifth magnetic element is closer to the center of the spot than the sixth magnetic element,
the light detection element further includes a third intermediate layer between the first ferromagnetic layer of the fifth magnetic element and a light irradiation surface that is a surface on a side irradiated with the light of the light detection element, and
the light detection element further includes a fourth intermediate layer between the first ferromagnetic layer of the sixth magnetic element and the light irradiation surface, and
wherein the fourth intermediate layer has higher transmittance of the light than that of the third intermediate layer.

9. A receiving device comprising:
the light detection element according to claim 1.

10. A light sensor device comprising:
the light detection element according to claim 1.

11. The light detection element according to claim 1,
wherein, when an intensity of the light applied to the first ferromagnetic layer increases, a magnetization of the first ferromagnetic layer is inclined from the initial state by an external energy according to the application of the light.

12. The light detection element according to claim 1,
wherein, a magnitude of a magnetization of the first ferromagnetic layer decreases from an initial state by an external energy according to the application of light when an intensity of the light applied to the first ferromagnetic layer increases.

13. The light detection element according to claim 1,
wherein the optical device is larger than the spot of the light.

* * * * *